US008044672B2

(12) United States Patent
Williams

(10) Patent No.: US 8,044,672 B2
(45) Date of Patent: Oct. 25, 2011

(54) METHOD FOR MEASURING D-Q IMPEDANCE OF POLYPHASE POWER GRID COMPONENTS

(76) Inventor: Michael Lamar Williams, Frederick, MD (US)

( * ) Notice: Subject to any disclaimer, the term of this patent is extended or adjusted under 35 U.S.C. 154(b) by 428 days.

(21) Appl. No.: 12/409,093

(22) Filed: Mar. 23, 2009

(65) Prior Publication Data

US 2009/0230980 A1 Sep. 17, 2009

Related U.S. Application Data

(63) Continuation-in-part of application No. 11/691,948, filed on Mar. 27, 2007, now Pat. No. 7,508,224.

(60) Provisional application No. 60/790,146, filed on Apr. 7, 2006.

(51) Int. Cl.
*G01R 27/08* (2006.01)
(52) U.S. Cl. ........................................ 324/707; 324/602
(58) Field of Classification Search .................. 324/707, 324/602, 600, 527, 521, 522
See application file for complete search history.

(56) References Cited

U.S. PATENT DOCUMENTS

| | | | | |
|---|---|---|---|---|
| 4,851,782 | A | * | 7/1989 | Jeerings et al. ................ 324/520 |
| 6,756,786 | B2 | * | 6/2004 | Choi et al. ..................... 324/509 |

OTHER PUBLICATIONS

Williams,Michael L. Measurement of Stability Margins in Single-Phase and Polyphase Switchmode Power Systems, (Interim Report), Mar. 31, 1997; Appendix B—Analysis of Stability Margin Test Data, Jul. 15, 1998, Contractor Report to the Naval Surface Warfare Center (NSWC) Annapolis, MD, Code 814.

Michael L. Williams; "Measurement of Stability Margins in Single-Phase and Polyphase Switchmode Power Systems—A Tutorial Introduction," Proceedings, American Society of Naval Engineers Electric Machines Technology Symposium, Jan. 2004, Philadelphia, PA.
Zizliauskas, Povilas "Subsynchronous Torque Interaction for HVDC Light B—A Theoretical Description" M.Sc. Thesis, Dept Industrial Electrical Engineering and Automation, Lund University CODEN:LUTEDX/(TEIE-5153)/1-39 (2001).
Belkhayat, M., Williams, M.L., "Impedance Extraction Techniques for DC and AC Systems," Proceedings, Third Naval Symposium on Electric Machinery, Dec. 2000, Philadelphia, PA.
Schaefer, Richard C. "Understanding Power System Stability" Basler Electric Co. Power Systems Catalog vol. 5 Winter 2005/2005 Application Notes.
Lancaster. D. "CMOS Cookbook" Second Ed. 1997, Butterworth-Heineman, ISBN 0-7506-9943-4.
Chapman, Stephen J. "Electric achin Fundamentals" Second Edition, McCraw-Hill, Inc., University of Houston, Feb. 23, 2009.

* cited by examiner

*Primary Examiner* — Vincent Q Nguyen
(74) *Attorney, Agent, or Firm* — Aust IP Law; Ronald K. Aust, Esq.

(57) ABSTRACT

A method is provided for measuring D-Q impedance of a component of a polyphase power grid connected to a grid node, and evaluating the margin of stability at a node using Nyquist diagrams generated from the measured D-Q impedance data. A generator, coupled to the polyphase power grid, is controlled to induce suppressed-carrier stimulus current into the grid node. Circuitry measures response signals of suppressed-carrier form existing within a bus voltage at the grid node and a branch current of the component being measured. The method includes measuring complex voltage components of the response signals contained in the bus voltage and complex current components of the response signals contained in the branch current to form simultaneous equations that are resolved to determine the D-Q impedance parameters Zqq, Zqd, Zdq and Zdd of the measured component.

14 Claims, 25 Drawing Sheets

 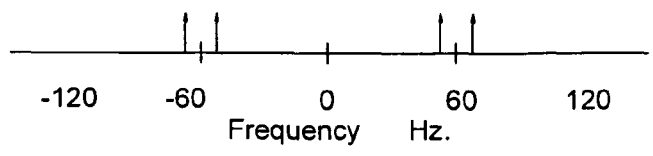
(PRIOR ART) FIG. 1A
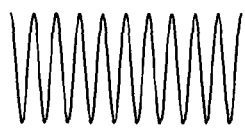 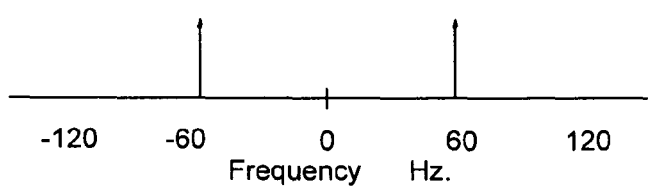
(PRIOR ART) FIG. 1B
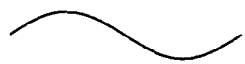 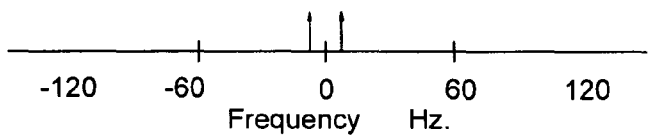
(PRIOR ART) FIG. 1C
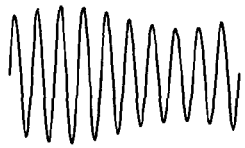 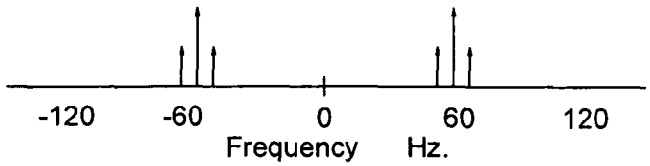
(PRIOR ART) FIG. 1D
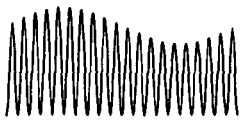 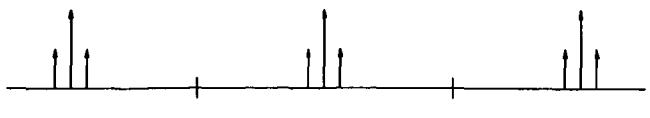
(PRIOR ART) FIG. 1E

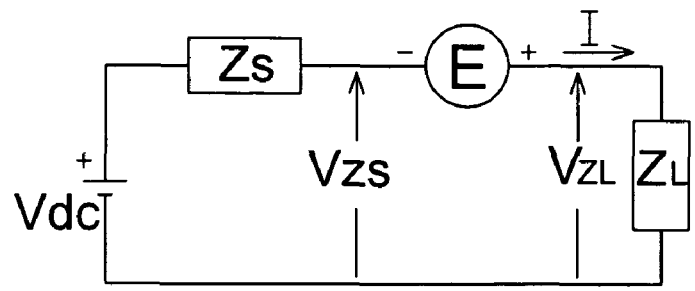
(PRIOR ART) FIG. 2
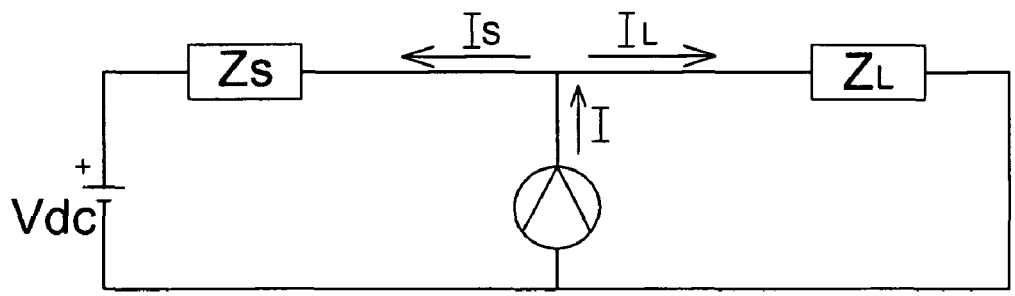
(PRIOR ART) FIG. 3
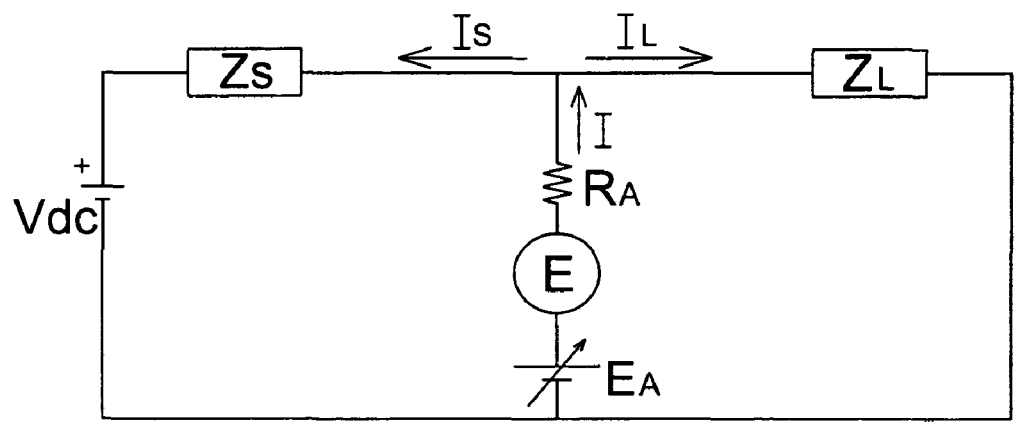
(PRIOR ART) FIG. 4

METHOD FOR MEASURING D-Q IMPEDANCE OF POLYPHASE POWER GRID COMPONENTS

CROSS-REFERENCE TO RELATED APPLICATIONS

This is a continuation-in-part of U.S. patent application Ser. No. 11/691,948, entitled "METHOD FOR MEASURING STABILITY MARGIN AT A NODE OF A POLYPHASE POWER GRID", filed Mar. 27, 2007 now U.S. Pat. No. 7,508,224, which based upon U.S. provisional patent application Ser. No. 60/790,146, entitled "MEANS OF MEASURING STABILITY MARGIN AT NODES OF THE NATIONAL POWER GRID", filed Apr. 7, 2006.

GOVERNMENT RIGHTS IN PATENT

Early work on AC stability, prior to the present invention, was made with the proceeds from government contract no. N00167-96-D0045/0004. However, federal funding was not involved in the invention claimed herein.

BACKGROUND OF THE INVENTION

1. Field of the Invention

The present invention relates to a polyphase power grid, and, more particularly, to a method for measuring D-Q impedance of polyphase power grid components.

2. Description of the Related Art

The transmission capacity of a power grid, e.g., the national power grid, is limited by factors such as voltage stability, transient stability and oscillatory stability, in addition to thermal overload conditions that result in excessive transmission line sag. The potential for oscillatory instability, also known as subsynchronous resonance, is of particular concern because the transition from stable to unstable conditions can be quite abrupt and may occur without warning. In a matter of seconds, a power system that becomes small-signal unstable can transition to a condition of large amplitude voltage, current and torque fluctuation that can be highly disruptive and destructive. Although voltage and current waveforms in the system may provide warnings of an impending instability, this is not always the case. A system that has a low margin of stability can operate very close to the threshold of instability while showing no signs of impending oscillation if there are no perturbations on the system with energy in the spectral range near the frequency of minimum stability margin. A slight change in operating conditions, such as a small increase in load, can cause the system to cross the threshold and suddenly experience violent excursions.

A primary cause of oscillatory instability is negative resistance. For example, switchmode power converters are being employed in increasing numbers and higher power capacities. The high efficiency and well regulated outputs that can be obtained with this technology bring with it an inherent negative resistance characteristic at the AC input that can cause oscillatory instability. Variable Speed Drives also offer high efficiency and well-controlled performance but with similar negative resistance characteristic. High Voltage DC (HVDC) transmission systems have desirable characteristics that avoid many of the difficulties of AC power transmission. HVDC transmission systems are members of the switchmode power converter family and have similar negative input resistance qualities. Induction motors, which may exhibit a negative input resistance, constitute the major portion of the load on the transmission system.

Methods of stability margin measurement in DC powered switchmode power converter systems are well established in the industry. A theoretical basis for measuring the margin of stability at the AC interface, the method of constructing special electronic test equipment required for such measurement and the method of performing these measurements was disclosed in "Measurement of Stability Margins in Single-Phase and Polyphase Switchmode Power Systems" (Interim Report), 31 Mar. 1997, Contractor Report to the Naval Surface Warfare Center (NSWC) Annapolis, Md., Code 814, Williams, Michael L. The method employs the use of suppressed-carrier stimulus and product demodulation of the amplitude-modulated response signals. A tutorial paper explaining the theoretical basis for his method of measuring the stability margin at AC power interfaces may be found in "Measurement of Stability Margins in Single-Phase and Polyphase Switchmode Power Systems—A Tutorial Introduction," Proceedings, American Society of Naval Engineers Electric Machines Technology Symposium, January 2004, Philadelphia, Pa., Williams, Michael L.

The suppressed-carrier waveform of FIG. 1A is formed by multiplying the 60 Hertz (Hz) power line voltage waveform of FIG. 1B by the test frequency waveform of FIG. 1C, under the assumption that the selected test frequency is 6 Hz. FIG. 1D is the amplitude modulated power line voltage or current. FIG. 1E is the demodulated voltage or current waveform formed by multiplying the waveform of FIG. 1D by the waveform of FIG. 1B.

The envelope of the suppressed-carrier waveform follows the shape of the test frequency waveform if we account for the phase reversal in the second half. The fine structure of the suppressed-carrier waveform is in-phase with the power line voltage waveform during the first half cycle of the test frequency waveform but is out-of-phase during the second half when the test frequency waveform goes negative. The positive peaks of the waveform in FIG. 1A follow the form of the 6 Hz waveform in FIG. 1C during the first half cycle, but the negative peaks follow the waveform during the second half cycle. The spectrum associated with each of the waveforms is presented. The frequency of the spectral lines of the suppressed-carrier waveform of FIG. 1A can be determined from the trigonometric identity of equation EQ. 1. When the 60 Hz power line waveform is multiplied by a 6 Hz test frequency waveform, the result is a suppressed-carrier waveform with double-sided spectral components at 60+/−6 Hz and −60+/−6 Hz.

$$\text{Cos } B \text{ Cos } C = \tfrac{1}{2}[\text{Cos}(B+C)+\text{Cos}(B-C)] \quad \text{EQ. 1}$$

In DC switchmode power converter systems, stability is determined by the complex ratio of source impedance, ZS, to the load impedance, ZL, formed by the input impedance of the converter. This method is well established in the industry. In FIG. 2 the transfer function VZL/E, shown in equation EQ. 2, becomes infinite if the complex ratio ZS/ZL becomes equal to minus one.

$$VZL/E = 1/(1+ZS/ZL) \quad \text{EQ. 2}$$

VZL is an AC voltage developed across the load impedance at the test frequency, and E is the injected sinusoidal stimulus voltage. The complex ratio ZS/ZL can be plotted on a Nyquist diagram to evaluate the degree of stability. For a stable system, the closeness of approach of ZS/ZL to the point −1+j0 provides a convenient one-dimensional measure of the margin of stability. The closeness of approach is defined by the magnitude of the vector quantity 1+(ZS/ZL), which is known in circuit theory as the Return Difference. The threshold of instability occurs when 1+(ZS/ZL) becomes equal to zero.

Stability margins of DC systems are measured by injecting a sinusoidal voltage or sinusoidal current stimulus. Sinusoidal response signals are produced as the induced stimulus current interacts with the source impedance and load impedance. The information needed to determine the margin of stability is contained in the relative amplitude and phase of these two response signals. The complex ratio ZS/ZL can be determined by the ratio of voltages VZS and VZL shown in FIG. 2 (equation EQ. 3), or by the ratio of currents IL and IS (equation EQ. 4) as shown in FIG. 3 and FIG. 4.

$$ZS/ZL=-VZS/VZL \qquad \text{EQ. 3}$$

$$ZS/ZL=IL/IS \qquad \text{EQ. 4}$$

Respectively, VZS and VZL are the AC voltages developed across the source impedance and load impedance at the test frequency. Likewise, IS and IL are the AC currents flowing in the source and load impedance. The test frequency is swept over the band of interest.

FIG. 3 assumes the sinusoidal stimulus current is injected by an ideal current source. FIG. 4 assumes that the stimulus current is injected by a sinusoidal voltage source, E, having finite impedance, RA, which may be low. It is noted that the current ratio IL/IS is not altered by the impedance of the current source. The DC voltage, EA, is adjusted to minimize the DC current flowing in RA. Noted further, a system having a ZS/ZL ratio that encircles the point −1+j0 can be made stable by a sufficiently low value of the current source impedance, RA. In such cases, measurements can be made of the ratio, ZS/ZL, at points approaching the threshold of instability from both directions. Interpolation using two points on either side of the stability threshold can improve the accuracy of determining the threshold.

In DC systems, the response signals are sinusoidal and the margin of stability is determined by the relative amplitude and phase angle of the two sinusoidal responses. In AC systems, the response signals are the envelopes of the amplitude-modulated waveforms produced by the suppressed-carrier stimulus current acting on the source and load impedance. The margin of stability can be determined by the relative amplitude and phase angle of the modulation envelopes of the two response signals. In principle, the stability margin could be determined by observing the relative amplitude and phase shift of the modulation envelopes with an oscilloscope. In practice, the envelopes of the waveforms are extracted by demodulation and the relative amplitude and phase are determined with a narrowband network analyzer. This process provides a high degree of accuracy in measuring the amplitude and phase angles of the response signals. It also provides a high degree of discrimination against noise, distortion and interference. The DC case may be considered to be simply a special case of the more general AC case, a special case in which the power line frequency is zero.

The suppressed-carrier stimulus produces an amplitude modulation of the quiescent AC power waveforms. In FIG. 2, if the injected sinusoidal stimulus voltage, E, is relocated to the left side of ZS, it may be seen that the injected stimulus effectively amplitude modulates the quiescent DC voltage. With the relocation of the stimulus voltage, E, the stability margin continues to be determined by the ratio of the AC voltages VS and VL across the source and load impedance. Both the AC and DC cases involve amplitude modulation.

Consider a situation in which both the DC case and AC case are to be stimulated at the test frequency FS=6 Hz. In FIG. 1A, the spectrum of the suppressed-carrier waveform consists of modulation sidebands resulting from product modulation of the 60 Hz power line waveform of FIG. 1B by the 6 Hz test frequency waveform of FIG. 1C. The spectrum of the 6 Hz sine wave of FIG. 1C has been translated in frequency by +/60 Hz. If the power line frequency were to be reduced, the spectral pairs of FIG. 1A would remain separated by 2FS, but they would move closer to zero. If the power line frequency is further reduced to zero, the spectral pairs of FIG. 1A converge and become identical to the spectrum of the test frequency sinusoid shown in FIG. 1C. The AC case is identical to the DC case, if the power line frequency is reduced to zero. From the perspective of amplitude modulation, the DC and AC cases are similar. From the spectral viewpoint, the AC and DC cases are similar. Conceptually, DC can be considered to be simply a single point on the continuum of positive and negative frequency.

In an unstable rotary system, experiencing mild subsynchronous oscillation at 3 Hz, the torsional shaft oscillation will occur at 3 Hz, and the system voltages and currents will be amplitude modulated with a 3 Hz envelope. There will be no 3 Hz component in the power line voltage or current waveforms. Instead, the spectral components of the oscillation will occur at 60+/−3 Hz.

As in the DC case, there are a number of variations in which the suppressed-carrier method of stability margin measurement may be configured. Stimulus may be provided by series voltage injection or parallel current injection. When series voltage injection of the stimulus is employed, the response signals are sensed as voltages developed across the source impedance and load impedance. When parallel current injection of the stimulus is employed, the response signals are sensed as currents flowing in the source impedance and load impedance. Series voltage injection tends to be invasive, requiring disruption of power flow to insert the injection transformers.

FIG. 5 illustrates the method of stability margin measurement in 3-phase AC systems using series voltage stimulus injection. The generator supplies power to a switchmode power converter load via source impedance, ZS. The switchmode power converter has a constant-power nature with characteristic negative resistance input. This load is represented by a Wye connected network having a per-leg impedance ZL. The blocks labeled L/N convert the three phase line voltages to line-to-neutral form in order to accommodate floating delta power. An artificial neutral point is created at the centroid of the line-to-line voltage vectors. The block labeled SCMOD contains three multipliers that form the suppressed-carrier stimulus voltages by multiplying samples of the respective line-to-neutral voltages by the test signal waveform, at frequency FS. The suppressed carrier waveforms are inserted in the associated phase via transformers driven by power amplifiers. In this application, it is assumed that the phase shift produced by the source impedance is small at the power system frequency. This allows the phase references to be taken from the undistorted generator output rather than the junction of ZS and ZL that may have severe distortion resulting from rectification harmonics.

The suppressed carrier stimulus signals cause the phase voltages, on either side of the SCMOD block, to be amplitude modulated. The response signals are in the form of these amplitude-modulated voltages on either side of the injected suppressed-carrier stimulus voltage. The blocks labeled PDMOD contain three product demodulators that multiply line-to-neutral samples of the amplitude-modulated waveforms by their respective line-to-neutral samples of the reference phase voltage. The three outputs of the PDMOD blocks have a DC component and the fine structure of the waveforms has a frequency that is two times that of the power line. These waveforms retain the modulation envelope of the amplitude-modulated waveforms. The blocks labeled + sum the outputs of the PDMOD blocks. Because the double frequency component of the PDMOD outputs exist at phase angles of 120 degrees relative to each other, they tend to sum toward zero. The output of the + blocks contains the desired sinusoid, at the test frequency, having an amplitude and phase that relates to the envelope of the amplitude-modulated waveforms. The sum also contains a DC component that is removed by capacitor coupling of the network analyzer input. The network analyzer measures the relative amplitude and phase of the two outputs of the + blocks to determine the desired value of ZS/ZL at the test frequency, FS. The test frequency is swept over the frequency range of interest and the ZS/ZL ratio is plotted as a Nyquist diagram on the network analyzer display. The margin of stability is read from the Nyquist display.

FIG. 6 illustrates a test configuration that employs stimulus in the form of suppressed-carrier current wherein the response signals are sensed as currents. In this example an auxiliary 60 Hz power source is employed to supply the bulk of the volt-amperes required for stimulus injection. The AUX power source is synchronized with the three phase voltages at the junction of ZS and ZL. When synchronized, the AUX source supplies negligible 60 Hz current to the junction of ZS and ZL. The block labeled SC MOD is the same as that in FIG. 5. It injects suppressed-carrier voltage stimulus in series with the outputs of the AUX power source. The resistors, labeled R, connect one side of the SC MOD block with the junction of ZS and ZL. In this configuration, the suppressed-carrier stimulus voltages cause suppressed-carrier stimulus currents to be injected into the junction of ZS and ZL. This set of stimulus currents is labeled I. In accordance with the current division theorem illustrated in FIG. 3 and FIG. 4, the stimulus currents divide in inverse proportion to the ratio ZS/ZL. Two sets of current transformers sense the divided stimulus currents flowing toward the prime power source and the load. After demodulation and summation, the network analyzer measures the ratio IL/IS to determine the ratio ZS/ZL in accordance with equation EQ. 4.

The test frequency, FS, is swept over the band of interest. The network analyzer measures the ratio IL/IS and plots the quantity ZS/ZL as a Nyquist diagram to determine the stability margin. The load, represented by ZL, may include a rectifier that causes significant harmonic distortion at the junction of ZS and ZL. In FIG. 6, it is assumed that the modulator/demodulator reference signals must be obtained from distorted signals at this junction. The BPF blocks provide bandpass filtering that removes harmonic distortion to provide relatively clean reference signals. Bandpass filtering produces no phase shift at the center frequency. In this situation, the predominant harmonics are likely to be 5th and 7th. These harmonics are well removed from the 60 Hz fundamental and are adequately attenuated by bandpass filters having modest Q.

The resistors in the stimulus injection path are intended to ease the problem of equalizing the AC voltage of the AUX power source with that existing at the point of stimulus injection and to minimize the flow of harmonic distortion currents in the injection path. In the choice of the value of the resistors, R, it should be remembered that the stability margin measurement is a small-signal measurement. If there is significant harmonic distortion at the junction point resulting from rectification harmonics, the resistance values should be sufficiently large to avoid altering the commutation timing of the rectification process. Larger values of resistance require a larger volt-ampere output of the power amplifiers used for stimulus injection. At lower power levels, amplifiers are available that have the capability of providing sufficient power for stimulus injection.

The data points obtained from the stability margin measurement are combined and presented as a Nyquist diagram. The stability margin is determined by the closeness of approach of the Nyquist plot to the point $-1+j0$.

Substantial obstacles exist in the practical application of the above-described methods in the measurement of stability margin and/or impedance at nodes of the national power grid. These methods were developed to measure the stability margin at the AC power interface of switched-mode power converter systems operating at power levels of less than approximately 100 KW, whereas the national power grid, or portions thereof, operate at hundreds or thousands of megawatts.

For example, switchmode power converters normally have significant bandwidth in their regulator control loops that causes the frequency of potential instability to occur at frequencies that are well separated from the power line frequency, whereas oscillatory instability of the national power grid generally occurs at frequencies that lie in the range of 0.1 Hz to 3.0 Hz, thereby producing modulation sidebands that must be measured at frequencies that are separated from the power line frequency by an amount of only 0.17 percent to 5.0 percent. The close proximity to the power line frequency requires their measurement to be made in the frequency region of significant phase noise existing near the shifting power line frequency.

Also, for example, for switchmode power converter systems, stimulus injection is normally provided by power amplifiers having sufficient capacity to supply suppressed-carrier stimulus injection on the order of 0.03 Per Unit, which is an order of magnitude higher than the level of stimulus injection that would be permissible for application in determining stability margin and/or impedance at nodes of the national power grid.

SUMMARY OF THE INVENTION

The present invention provides a method for measuring the D-Q impedance of components of a power grid, and evaluating the margin of stability at nodes of a power grid, e.g., the national power grid, using the Nyquist stability criteria applied to a Nyquist diagram derived from D-Q impedance characterization of the involved power grid components, thereby aiding the analysis and computer modeling of the power grid to improve performance and make the grid more robust and resistant to disturbances such as, for example oscillatory instability.

The invention, in one form thereof, is directed to a method for measuring D-Q impedance of a component of a plurality of polyphase power grid components connected to a grid node in a polyphase power grid, the component being at least one electrical device. The plurality of components includes a generator, as one component of the plurality of polyphase power grid components, coupled to the polyphase power grid. The generator has a speed input to regulate generator no-load speed and a field input to regulate field excitation of the generator, with the no-load speed and field excitation being used to cause the generator connected to the grid node on the polyphase power grid to induce suppressed-carrier stimulus current into the grid node. The measuring is performed by circuitry to measure response signals of suppressed-carrier form existing within a bus voltage at the grid node and a branch current of the component being measured. The method includes applying each test frequency signal of a first frequency sweep over a frequency band of interest to the speed input of the generator while measuring the response signals in the bus voltage in real and imaginary form to generate a first set of voltage values; applying each test frequency signal of a second frequency sweep over the frequency band of interest to the speed input of the generator while measuring the response signals in the branch current in real and imaginary form to generate a first set of current values; processing the first set of voltage values and the first set of current values to form a first set of two equations of four simultaneous equations; applying each test frequency signal of a third frequency sweep over the frequency band of interest to the field input of the generator while measuring the response signals in the bus voltage in real and imaginary form to generate a second set of voltage values; applying each test frequency signal of a fourth frequency sweep over the frequency band of interest to the field input of the generator while measuring the response signals in the bus current in real and imaginary form to generate a second set of current values; processing the second set of voltage values and the second set of current values to form a second set of two equations of the four simultaneous equations; and resolving the four simultaneous equations to determine the D-Q impedance parameters Zqq, Zqd, Zdq and Zdd of the measured component.

The invention, in another form thereof, is directed to a method for measuring D-Q impedance of a component of a plurality of polyphase power grid components connected to a grid node in a polyphase power grid, the component being at least one electrical device. The plurality of components includes a generator, as one component of the plurality of polyphase power grid components, coupled to the polyphase power grid. The generator has a speed input to regulate generator no-load speed and a field input to regulate field excitation of the generator, with the no-load speed and field excitation being used to cause the generator connected to the grid node on the polyphase power grid to induce suppressed-carrier stimulus current into the grid node. The measuring is performed by circuitry to measure response signals of suppressed-carrier form existing within a bus voltage at the grid node and a branch current of the component being measured. The method includes applying each test frequency signal of a first frequency sweep over a frequency band of interest to the speed input of the generator; measuring complex voltage components of the response signals contained in the bus voltage and complex current components of the response signals contained in the branch current to form a first set of two equations of four simultaneous equations; applying each test frequency signal of a second frequency sweep over a frequency band of interest to the field input of the generator; measuring complex voltage components of the response signals contained in the bus voltage and complex current components of the response signals contained in the branch current to form a second set of two equations of the four simultaneous equations; and resolving the four simultaneous equations to determine the D-Q impedance parameters Zqq, Zqd, Zdq and Zdd of the measured component.

BRIEF DESCRIPTION OF THE DRAWINGS

The above-mentioned and other features and advantages of this invention, and the manner of attaining them, will become more apparent and the invention will be better understood by reference to the following description of embodiment of the invention taken in conjunction with the accompanying drawings, wherein:

FIGS. 1A, 1B, 1C, 1D and 1E respectively illustrate the waveforms and the spectra of: (a) suppressed-carrier, (b) unmodulated power line voltage or current, (c) test frequency sinusoid, (d) amplitude modulated power line voltage or current, (e) demodulated voltage or current.

FIG. 2 is a simplified schematic of the method of measuring the margin of stability in DC systems with series voltage stimulus injection.

FIG. 3 is a simplified schematic of the method of measuring the margin of stability in DC systems with parallel current stimulus injection provided by an ideal current source.

FIG. 4 is a simplified schematic of the method of measuring the margin of stability in DC systems with parallel current stimulus injection provided by a low impedance current source.

Corresponding reference characters indicate corresponding parts throughout the several views. The exemplifications set out herein illustrate embodiments of the invention, such exemplifications are not to be construed as limiting the scope of the invention in any manner.

DETAILED DESCRIPTION OF THE INVENTION

Figure 7A:
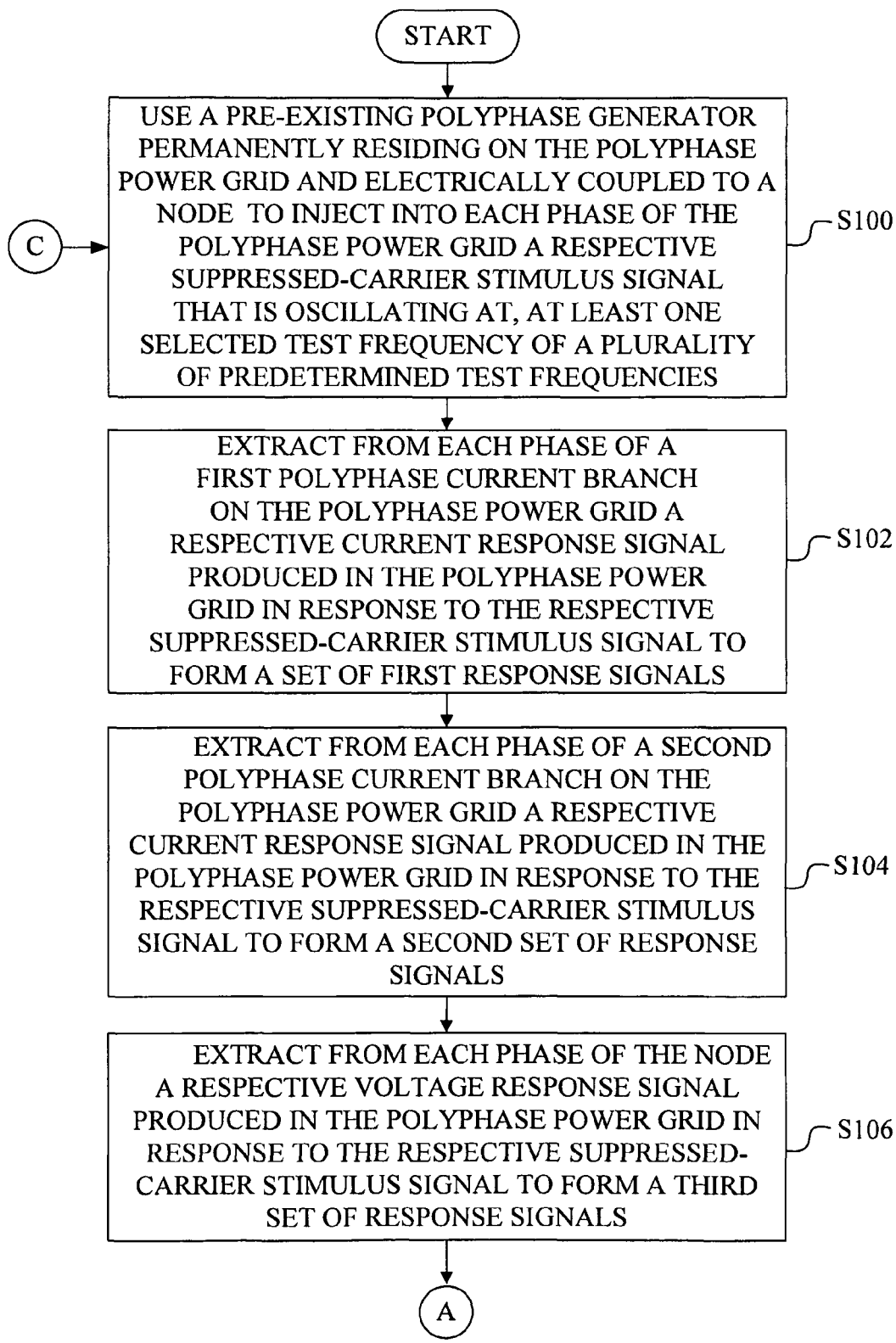
FIGS. 7A, 7B and 7C form a flowchart of a method for measuring a stability margin at a node, and a suppressed-carrier impedance of branches of a polyphase power grid, in accordance with embodiments of the present invention.
Figure 7B:
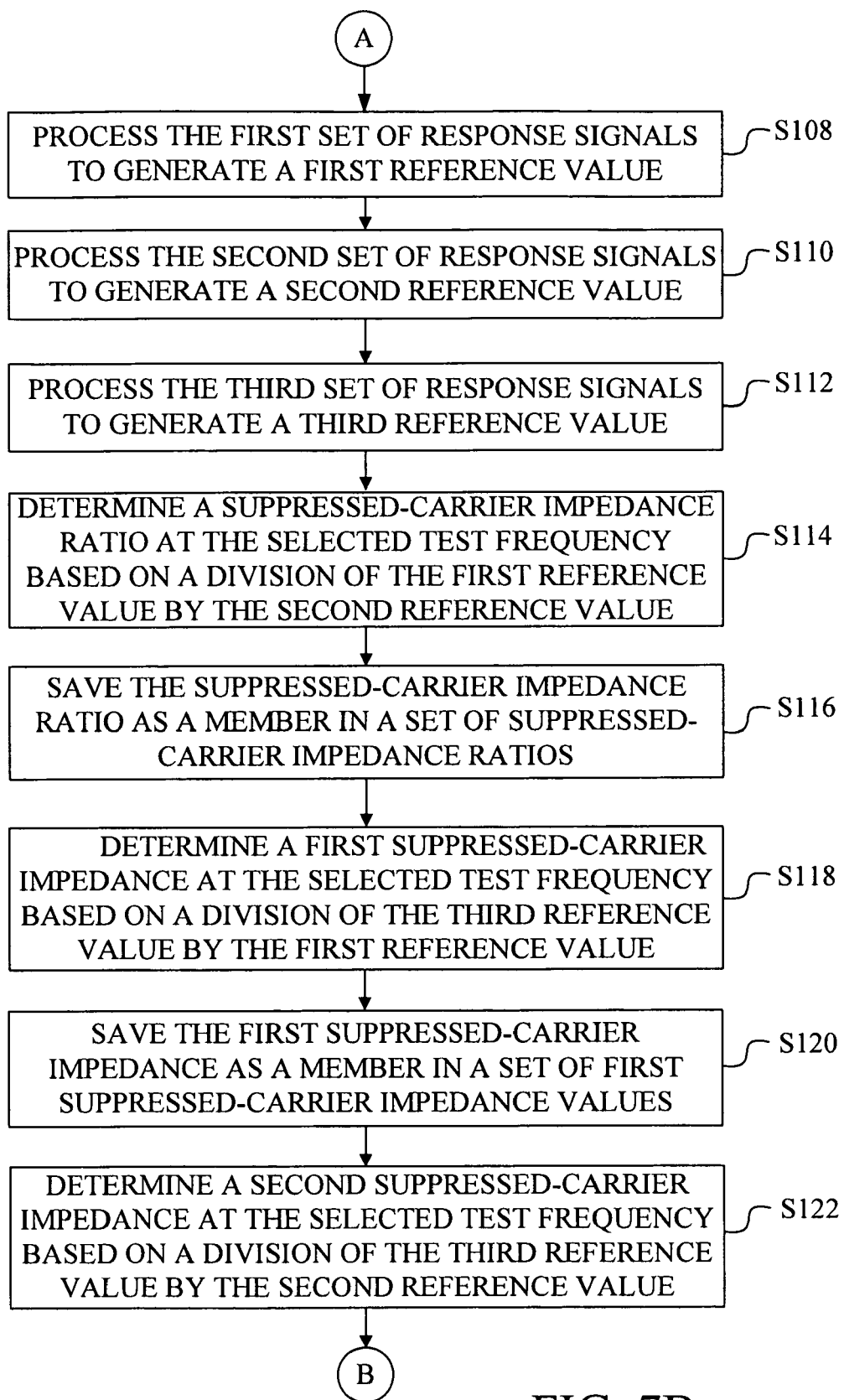
Figure 7C:
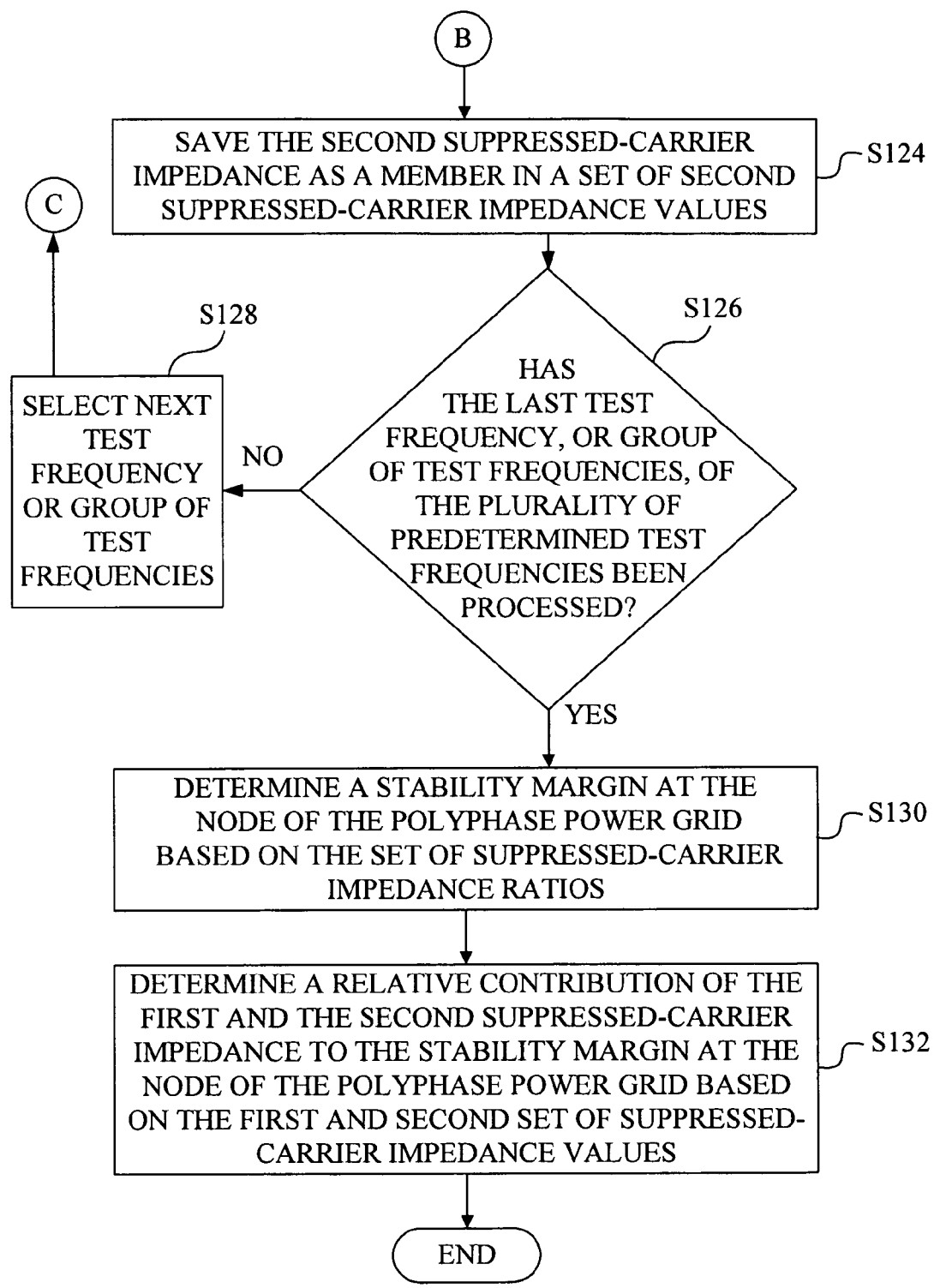

Referring now to the drawings and particularly to FIGS. 7A-7C, there is shown a flowchart of a method for measuring a stability margin at a node of a polyphase power grid, and an impedance of a branch connected to the node, in accordance with embodiments of the present invention, as illustrated generally in FIGS. 8-15.

Figure 11:
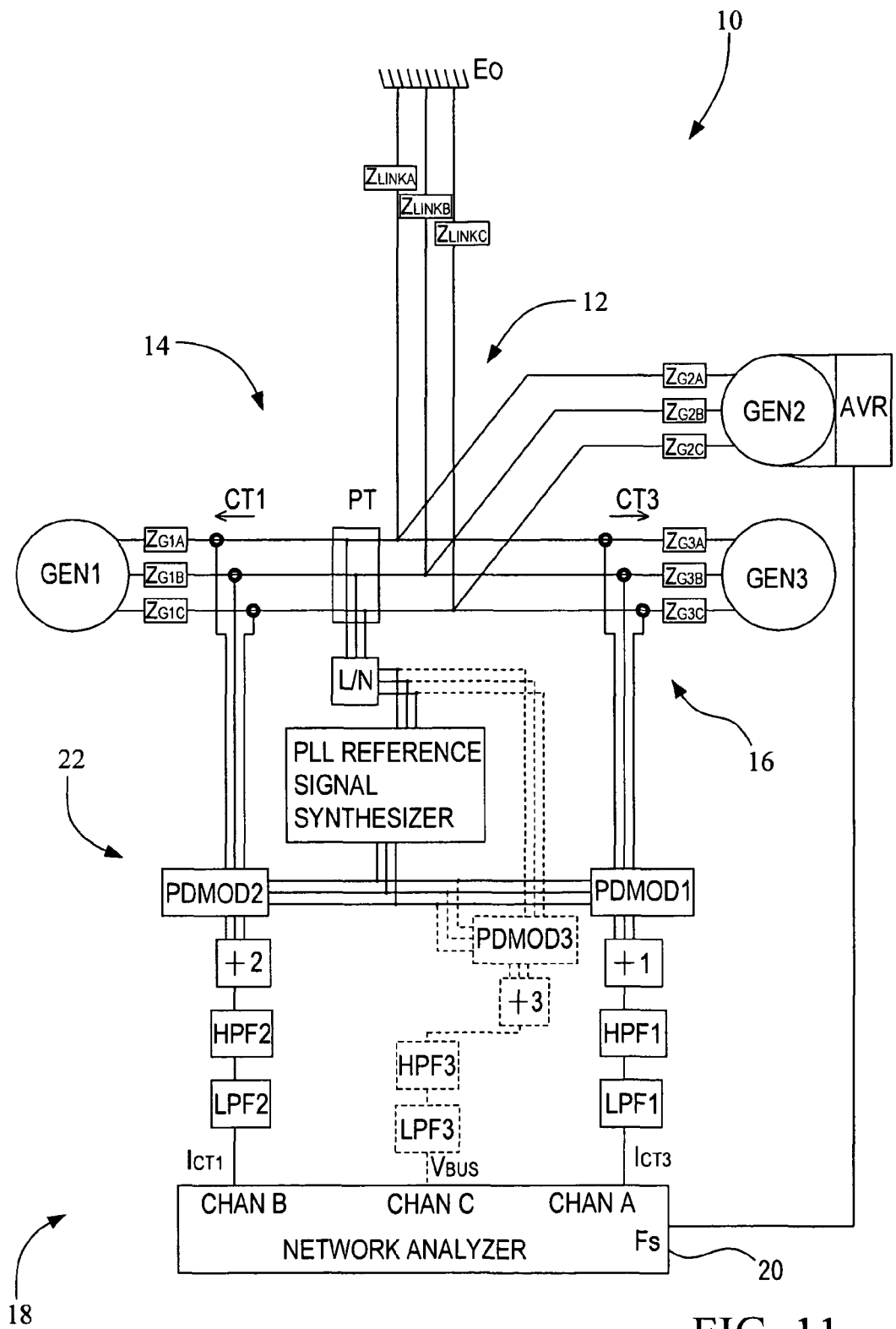
FIG. 11 is a more detailed diagram showing the test setup for stability margin measurement related to inter-unit oscillation assuming infinite system link reactance and the suppressed-carrier impedance measurement of the generators or groups of generators involved.

For convenience, and ease of understanding, the method of FIGS. 7A-7C will be described with particular reference to FIGS. 11, 20A and 20B. In this example, FIG. 11 is an exemplary configuration that may be used in measuring stability margin (using currents ICT3 and ICT1 respectively on channels CHAN A and CHAN B), and with the inclusion of an auxiliary configuration represented by dashed lines, may be used in measuring suppressed carrier impedance (using currents ICT3 and ICT1 respectively on channels CHAN A and CHAN B, and voltage VBUS on channel CHAN C). In FIG. 11, for example, there is shown an exemplary polyphase power grid 10 to which there is attached a plurality of generators, individually identified as generator GEN1, generator GEN2 and generator GEN3. Polyphase power grid 10 may be, for example, representative of the national power grid in the United States. GEN1 and GEN3 may be, for example, representative of groups of generators. As shown, the method will be implemented with respect to an exemplary node 12 on polyphase power grid 10. In this example, extending from node 12 is a first polyphase current branch 14 on polyphase power grid 10 and a second polyphase current branch 16 on polyphase power grid 10. First polyphase current branch 14 is electrically coupled to generator GEN1. Second polyphase current branch 16 is electrically coupled to generator GEN3. The exemplary configurations of FIG. 11, as well as those of FIGS. 12, 13, 14 and 15, will be described in more detail below, after the discussion of the flowchart of FIGS. 7A-7C.

In the present example, test equipment 18 is electrically coupled to first polyphase current branch 14 and second polyphase current branch 16. Test equipment 18 includes a commercially available multi-channel FFT network analyzer 20, current transformers (CT1, CT3) which may exist in the electric generation and transmission system, potential transformers (PT), a modification to the automatic voltage regulator AVR of a selected generator, e.g., GEN2, existing in the system, and custom electronic test equipment 22, including line-to-neutral circuit L/N; a Phase Locked Loop (PLL) Reference Signal Synthesizer; summation circuits +1, +2, and +3; highpass filters HPF1, HPF2, and HPF3; and lowpass filters LPF1, LPF2 and LPF3.

At act S100, a pre-existing polyphase generator, e.g., GEN2, permanently residing on polyphase power grid 10 and electrically coupled to a node 12 on polyphase power grid 10 is used to inject into each phase of polyphase power grid 10 a respective suppressed-carrier stimulus signal that is oscillating at, at least one selected test frequency of a plurality of predetermined test frequencies. In other words, in one embodiment, one test frequency of the plurality of predetermined test frequencies may be selected for each iteration, whereas in another embodiment, one group of test frequencies as a subset of the plurality of predetermined test frequencies may be selected for each iteration.

At act S102, the process extracts from each phase of first polyphase current branch 14 on polyphase power grid 10 a respective current response signal produced in polyphase power grid 10 in response to the respective suppressed-carrier stimulus signal to form a set of first response signals. The extraction of the respective current response signal from each phase may be facilitated, for example, by current transformers CT1. As shown in FIG. 11, for example, current transformers CT1 are electrically coupled to each phase of first polyphase current branch 14 for extracting the respective current response signal.

At act S104, the process extracts from each phase of second polyphase current branch 16 on polyphase power grid 10 a respective current response signal produced in polyphase power grid 10 in response to the respective suppressed-carrier stimulus signal to form a second set of response signals. The extraction of the respective current response signal from each phase may be facilitated, for example, by current transformers CT3. As shown in FIG. 11, for example, current transformers CT3 are electrically coupled to each phase of second polyphase current branch 16 for extracting the respective current response signal.

At act S106, the process extracts from each phase of node 12 a respective voltage response signal produced in polyphase power grid 10 in response to the respective suppressed-carrier stimulus signal to form a third set of response signals. The extraction of the respective voltage response signal from each phase may be facilitated, for example, by potential transformers PT. As shown in FIG. 11, for example, potential transformers PT may be electrically coupled to each phase at node 12 for extracting the respective voltage response signal.

At act S108, the first set of response signals is processed to generate a first reference value, e.g., current ICT1.

At act S110, the second set of response signals is processed to generate a second reference value, e.g., current ICT3.

At act S112, the third set of response signals is processed to generate a third reference value, e.g., bus voltage VBUS.

At act S114, the process determines a suppressed-carrier impedance ratio at the selected test frequency based on a division of the first reference value by the second reference value. In the present example, suppressed-carrier impedance ratio may be represented by the current ratio ICT1/ICT3.

At act S116, the suppressed-carrier impedance ratio determined at act S114 is saved as a member in a set of suppressed-carrier impedance ratios. The set of suppressed-carrier impedance ratios may be stored, for example, in a first memory location in network analyzer 20.

At act S118, the process determines a first suppressed-carrier impedance at the selected test frequency based on a division of the third reference value by the first reference value, e.g., VBUS/ICT1.

At act 120, the first suppressed-carrier impedance determined at act S118 is saved as a member in a set of first suppressed-carrier impedance values. The set of first suppressed-carrier impedance values may be stored, for example, in a second memory location in network analyzer 20.

At act S122, the process determines a second suppressed-carrier impedance at the selected test frequency based on a division of the third reference value by the second reference value, e.g., VBUS/ICT3.

At act S124, the second suppressed-carrier impedance determined at act S122 is saved as a member in a set of second suppressed-carrier impedance values. The set of second suppressed-carrier impedance values may be stored, for example, in a third memory location in network analyzer 20.

At act S126, it is determined whether the last test frequency, or group of test frequencies, of the plurality of predetermined test frequencies has been processed.

If the determination at act S126 is NO, then the process proceeds to act S128.

At act S128, the next test frequency, or group of test frequencies, of the plurality of predetermined test frequencies is selected. The process then returns to act S100, wherein acts S100-S126 are repeated for the next test frequency, or group of test frequencies.

If the determination at act S126 is YES, then the process proceeds to act S130.

At act S130, the process determines a stability margin at node 12 of polyphase power grid 10 based on the set of suppressed-carrier impedance ratios. The stability margin may be determined and displayed, for example, by network analyzer 20.

At act S132, the process determines a relative contribution of the first suppressed-carrier impedance and the second suppressed-carrier impedance to the stability margin at node 12 of polyphase power grid 10 based on the first set of suppressed-carrier impedance values and second set of suppressed-carrier impedance values. The relative contribution may be determined, for example, by comparing the relative amplitude and phase of the two impedances using the network analyzer 20 display, particularly in the frequency region near the point of minimum stability margin determined in act S130.

The method of FIGS. 7A-7C, and test equipment 18 used in implementing the method, is described in more detail below. The process establishes a test configuration for measuring the stability margin or impedance of interest and the mathematical modifications of the Nyquist diagram required to permit direct measurement of the margin of stability from the cursor readout of network analyzer 20. For a given set of operating conditions, such as equipment on line and level of power transmitted, the shape of the Nyquist diagram will tend to become recognizable and associated with the given set of conditions. With these operating conditions, it is to be expected that certain frequencies will become identified as being the critical frequencies at which the power system node, e.g., node 12, would be most susceptible to instability. Stability margin measurements can then be concentrated mainly in the critical frequency regions, with less frequent measurements made at other frequencies. The concentration of measurements at critical test frequencies permits greater use of vector averaging to improve the signal-to-noise ratio by allowing additional averaging time at these points. Multiple presentations of the stability margin display can be employed using long and short averaging times. The long-term average provides improved accuracy whereas the short-term average provides an earlier warning of impending instability.

Figure 8:
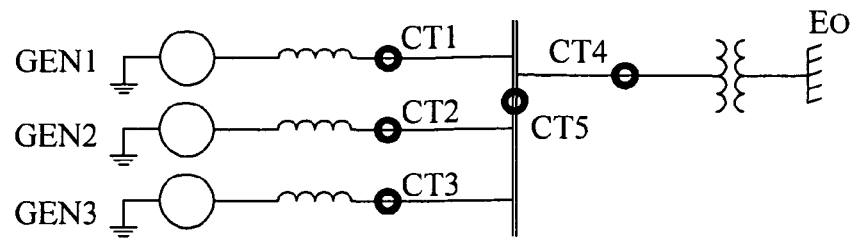
FIG. 8 is a diagram of the interconnection of generators and location of current transformers for the measurement of the stability margin related to inter-unit oscillation of generators.
Figure 9:
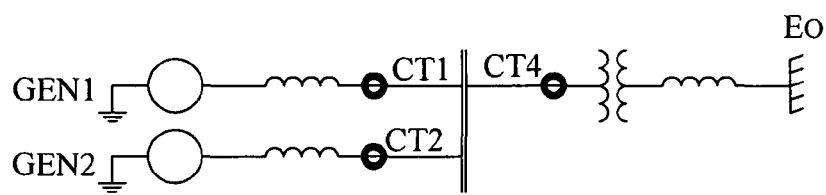
FIG. 9 is a diagram showing the interconnection of generators and location of current transformers for the measurement of the stability margin related to local-mode oscillation of generators.
Figure 10:
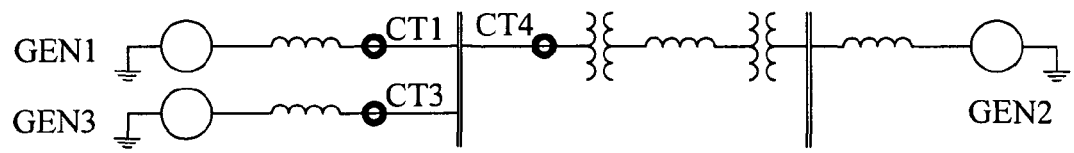
FIG. 10 is a diagram showing the interconnection of generators and location of current transformers for the measurement of the stability margin related to inter-area oscillation of generators.

In general, the process may involve: (a) selection the power system current transformer (CT) locations from which the current response signals will be obtained, as illustrated in FIG. 8, FIG. 9 and FIG. 10 and shown in more detail in FIGS. 11 through 15; (b) synthesizing, when necessary, the output of current transformers, such as theoretical current transformer CT5 in FIG. 8; (c) setting the gains of the programmable gain amplifiers in custom electronic test equipment 22; (d) determining suppressed-carrier impedance ratios from the inverse ratios of suppressed-carrier currents flowing in the subject impedances, as shown for example in FIG. 11, FIG. 12 and FIG. 13; (e) obtaining the suppressed-carrier impedance of branches, generators or other power system components from the ratio of the suppressed-carrier voltage at the input to the component and the suppressed-carrier currents flowing in the branch or component, as shown for example in FIG. 14; (f) obtaining the suppressed-carrier impedance, ZLINK, looking into to the transmission line connecting the generation station to the power grid from the ratio of the suppressed-carrier voltage at the node and the suppressed-carrier currents flowing into the transmission line, as shown for example in FIG. 15; (g) scaling, if and as required, the suppressed-carrier quantities in accordance with equations EQ. 5 and EQ. 6 (introduced below) using the built-in math functions of network analyzer 20; (h) modifying the display of network analyzer 20 by adding the quantity 1.0 to the Nyquist diagram display, using the built-in math functions of network analyzer 20, to cause the cursor readout to directly indicate the distance from the Nyquist diagram at the cursor position to the point $-1+j0$; and (i) moving the cursor to search for the minimum distance from the Nyquist diagram to the point $-1+j0$, that represent the margin of stability.

Perturbations of the Nyquist plot, resulting from system harmonics, noise or interference must be sufficiently small to provide a useful measurement of stability. Higher levels of stimulus injection improve the signal-to-noise ratio, but there are limitations on the injection level. Narrow bandwidths and longer averaging times improve the signal-to-noise ratio, but the time available to collect the data record and to average successive measurements is limited by the time period over which the grid conditions may be considered to be reasonably constant and the desire for real-time results. The approach to achieving the desired performance using low Per Unit stimulus injection levels includes optimized use of signal processing to maximize the resultant signal-to-noise ratio, maximized stimulus quality to minimize self-induced signal corruption, maximized demodulation reference signal quality to minimize the effects of power system voltage fluctuations, harmonics, noise and spurious interference, exploitation of system identification knowledge gained during the stability margin tests, and minimization of the effects of self-induced interference.

Measurement uncertainties include the random errors related to low signal-to-noise ratios, bias errors resulting from spurious interference, and the frequency response and phase shift of different types of current transformers. Random errors are reduced by vector averaging and curve fitting. Spurious interference is rejected by the use of very narrow analyzer bandwidth. Differences in phase shift produced by the current transformers would contribute directly as an error in the Nyquist diagram. In most test situations the phase difference should not be great enough to be very significant and knowledge of the type of transformers used in each particular location would permit the use of correction factors to minimize this source of residual error. In the case of HVDC Light B systems, for example, instabilities at frequencies as high as 40 Hz may occur that would involve modulation sidebands spread over the range of 20 Hz to 100 Hz. For such systems, it would be appropriate to employ wide bandwidth current sensors to obtain a flat frequency response.

FIGS. 8, 9 and 10 illustrate the response signal extraction required to apply the suppressed-carrier stability margin measurement method to these situations involving inter-unit, local-mode and inter-area oscillation. The sets of three current transformers for phases A, B and C of polyphase power grid 10 at each of the locations marked CT1, CT2, etc. may be formed as part of the normal power system instrumentation. Stimulus injection is provided by amplitude modulation of the voltage control signal of a generator's automatic voltage regulator, (AVR), e.g., that of generator GEN2.

As used herein, the term "inter-unit oscillations" are oscillations that result from two or more synchronous machines at a power plant or nearby power plants. The machines swing against each other, with the frequency of the power oscillation ranging between 1.5 to 3 Hz. Referring to act S100 of FIG. 7A, in one embodiment, the plurality of predetermined test frequencies span a frequency range of potential inter-unit oscillation of polyphase power grid 10. According, in this case, the frequency range may be from 1.5 Hz to 3.0 Hz, inclusive.

FIG. 8 presents the test configuration used to determine the stability margin, regarding inter-unit oscillation, of generator GEN3 when it is operating jointly with generator GEN1. Generator GEN2 may or may not be supplying power to the system. The leakage reactance of the step-up transformer forms a mutual coupling impedance that permits generator GEN3 to interact with other nearby generators and possibly engage in inter-unit oscillation. The current transformers shown at location CT5 are fictitious, i.e., theoretical, in that the current flowing at location CT5 may be determined by combining the outputs of the current transformers at locations CT1 and CT4.

The excitation of generator GEN2 is amplitude modulated at a test frequency, FS. This causes a suppressed-carrier current to flow into the bus. The stability margin of generator GEN3 is determined from the complex ratio ICT3/ICT5, where ICTi is the summation of phase currents sensed at location CTi after demodulation. The network analyzer sweeps the test signal over the frequency range of interest and extracts the test frequency component from the demodulated response signals, after summation. The output of network analyzer 20 is displayed as a Nyquist diagram, from which the margin of stability is obtained. A similar process can be used to determine the stability margin of generators GEN1 and GEN2.

If the current ratio ICT3/ICT1 and ICT1/ICT3 processed in a similar manner, the resulting Nyquist diagrams provide measurement of the stability margin of generator GEN3 and generator GEN1, respectively, regarding potential inter-unit oscillation assuming the connection to the infinite bus at EO is of infinite impedance and generator GEN2 is, in effect, disconnected. The margin of stability, for the assumed condition, is determined by the least distance from the Nyquist plot to the point $-1+j0$. As discussed with FIG. 4, the finite impedance of the step-up transformer combined with the impedance of generator GEN2 may cause the interconnection of generators GEN1 and GEN3 to operate in a stable manner even though they may be unstable if linked to EO by a higher impedance. It is noted that, if oscillation is occurring, one generator may be oscillating while another is simply responding to the suppressed-carrier stimulus provide by the oscillation of the other.

As used herein, the term "local-mode oscillations" means oscillations that result from one or more synchronous machines at a power station swinging together against a comparatively large power system or load center. The frequency of oscillation is in the range of 0.7 Hz to 2 Hz. These oscillations become troublesome when the power plant is at high load with a high reactance transmission system. Referring to act S100 of FIG. 7A, in one embodiment, the plurality of predetermined test frequencies span a frequency range of potential local-mode oscillation of polyphase power grid 10. According, in this case, the frequency range may be from 0.7 Hz to 2.0 Hz, inclusive.

FIG. 9 presents the test configuration used to determine the stability margin, regarding local-mode oscillation. The higher reactance of the transmission system tends to produce a lower frequency oscillation than that of the inter-unit case. The stability margin of a generator or group of generators represented by generator GEN1 can be measured. Generator GEN2 is used to inject a suppressed-carrier stimulus current into the bus. The current ratio ICT1/ICT4 is determined by network analyzer 20 from the sums of the demodulated currents obtained from locations CT1 and CT4. This complex ratio is used to produce a Nyquist diagram from which the margin of stability can be determined. The Nyquist diagram produced by this measurement represents the stability margin of generator GEN1 operating alone with generator GEN2 theoretically disconnected. A similar measurement can be used to determine the stability margin of generator GEN2 operating alone. The stability margin of the combination of generators GEN1 and GEN2 operating together to supply power to the system can be determined by combining the results of the separate measurements, as discussed later.

As used herein, the term "inter-area oscillations" means oscillations that result from combinations of many machines on one part of a power system swinging against machines on another part of the power system. Inter-area oscillations are normally in the frequency range of less than 0.5 Hz, but may occur as high as 0.7 Hz. Referring to act S100 of FIG. 7A, in one embodiment, the plurality of predetermined test frequencies span a frequency range of potential inter-area oscillation of polyphase power grid 10. According, in this case, the frequency range may be greater than 0 Hz and less than 0.7 Hz, inclusive.

FIG. 10 presents the test configuration used to determine the stability margin, regarding inter-area oscillation. The situation for inter-area oscillation involves a group of generators in one area that swing together within the group but swing against a similar group in a different area. The two groups are coupled together via a high reactance transmission system. The higher reactance of the transmission system tends to produce a lower frequency oscillation than that of the local-mode case.

The stability margin of one group of generators, represented in FIG. 10 by generator GEN1, can be measured by using another generator, labeled generator GEN3, to inject a suppressed-carrier stimulus current into the common point where the local group connects to the transmission system. The current ratio of ICT1 and ICT4 is measured by network analyzer 20 from the sums of the demodulated currents obtained from locations CT1 and CT4. The complex ratio ICT1/ICT4 is plotted as a Nyquist diagram from which the stability margin of generator GEN1 can be determined.

It is noted that instability existing on either end of the transmission line will cause a suppressed-carrier current to flow in the transmission line. Machines on an otherwise stable end would swing in response to this suppressed-carrier current. If the stability margin of these machines is low at the frequency of oscillation, the response will be accentuated.

FIG. 11 illustrates, in more detail, the test configuration of FIG. 8 to measure the stability margin of generator GEN1 with the assumption that the impedance linking these generators to the power system is infinitely large and that generator GEN2 is, in effect but not physically, disconnected. This situation becomes clearer when considered in the context of FIG. 4. Generator GEN2 serves to inject the suppressed-carrier stimulus current. The impedance of the stimulus source in this case is effectively the link impedance ZLINK in parallel with the impedance of generator GEN2. As discussed with respect to FIG. 4, the stimulus current divides in CT1 and CT3 in inverse proportion to the impedance of generators GEN1 and GEN3. The impedance of the stimulus source does not affect the division of the stimulus current. Therefore, the result of the measurement is the same as it would be if the impedance of the link and generator GEN2 were infinite. Network analyzer 20 is used to plot the Nyquist diagram of the complex ratio ICT1/ICT3. If the Nyquist diagrams encircle the point −1+j0 in a clockwise fashion, instability under the assumed condition is indicated. Although the assumed condition of an infinite ZLINK would not occur in practice, the measurement helps to demonstrate the effect of the link impedance on inter-unit stability of the generators.

The test frequency signal, FS, from network analyzer 20 is applied to the Automatic Voltage Regulator (AVR) of generator GEN2 to cause its output to be amplitude modulated. This causes a suppressed-carrier stimulus current to be injected into node 12 connecting the three generators GEN1, GEN2, GEN3 to polyphase power grid 10. The ideal stimulus is one that mimics the oscillation at the onset of instability. In one embodiment, for example, the ideal stimulus for the measurement of the margin of stability of a three-phase power system may be a set of three suppressed-carrier waveforms produced by multiplying pure phase A, phase B and phase C reference waveforms by a single pure sinusoidal waveform at the test frequency, FS. The phase A, B and C reference waveforms ideally are constant-amplitude pure sinusoids that are precisely in-phase with the fundamental frequency component of their respective power system line-to-neutral voltages, since any amplitude fluctuation, phase jitter, noise or distortion in these reference waveforms, or in the test-frequency sinusoid, will cause the spectrum of the stimulus to differ from the pure spectrum (see, e.g., FIG. 1A). Also, spurious content in the stimulus spectrum may degrade the signal-to-noise ratio of the test frequency component in the demodulated spectrum (see, e.g., FIG. 1E). In addition to the degradation of the signal-to-noise ratio, some imperfections in the stimulus waveforms may result in bias errors at the output of the demodulation process.

In general, the phase-lock loop reference signal synthesizers of custom electronic test equipment 22 use samples of the line-to-neutral power line voltages to produce pure Sine and Cosine reference signals that are phase-locked to the fundamental frequency component of the power system line-to-neutral voltages. The reference signals used for demodulation of the response signals are synthesized to ensure constant amplitude, low distortion and low phase noise. Each of the phase-lock loop reference signal synthesizers employs a clock that is phase locked to the fundamental frequency component of the power system line-to-neutral voltages. Analog multipliers are employed as phase detectors to make the phase detectors insensitive to power line harmonics and to provide very low sensitivity to noise and spurious interference that may be present on the power lines. The reference signal waveforms are synthesized to ensure constant amplitude and very low harmonic content. Any form of impurity in the reference signals employed in the demodulation process has the potential of degrading the signal-to-noise ratio or inducing bias errors in the demodulated response signals.

For the stability margin measurement, the in-phase (quadrature axis) reference signals are applied to the product demodulators labeled PDMOD (e.g., PDMOD1, PDMOD2, PDMOD3). The product demodulators labeled PDMOD produces sum and different frequencies of the 60 Hz power (summation circuits +1, +2, +3). The difference frequency is zero, resulting in a DC component. The DC component is large in relation to the desired test frequency component and would consume a large portion of the dynamic range of the analyzer input. This DC component is removed by highpass filtering, e.g., by highpass filters HPF1, HPF2, HPF3. The highpass filter cut-off frequency must be sufficiently low to cause negligible attenuation of the test frequency. Highpass filters are used for each of the response signals obtained after demodulation and summing. Gain and phase matching of these filters is required. Any mismatch would contribute directly as an error in the Nyquist diagram.

Figure 5:
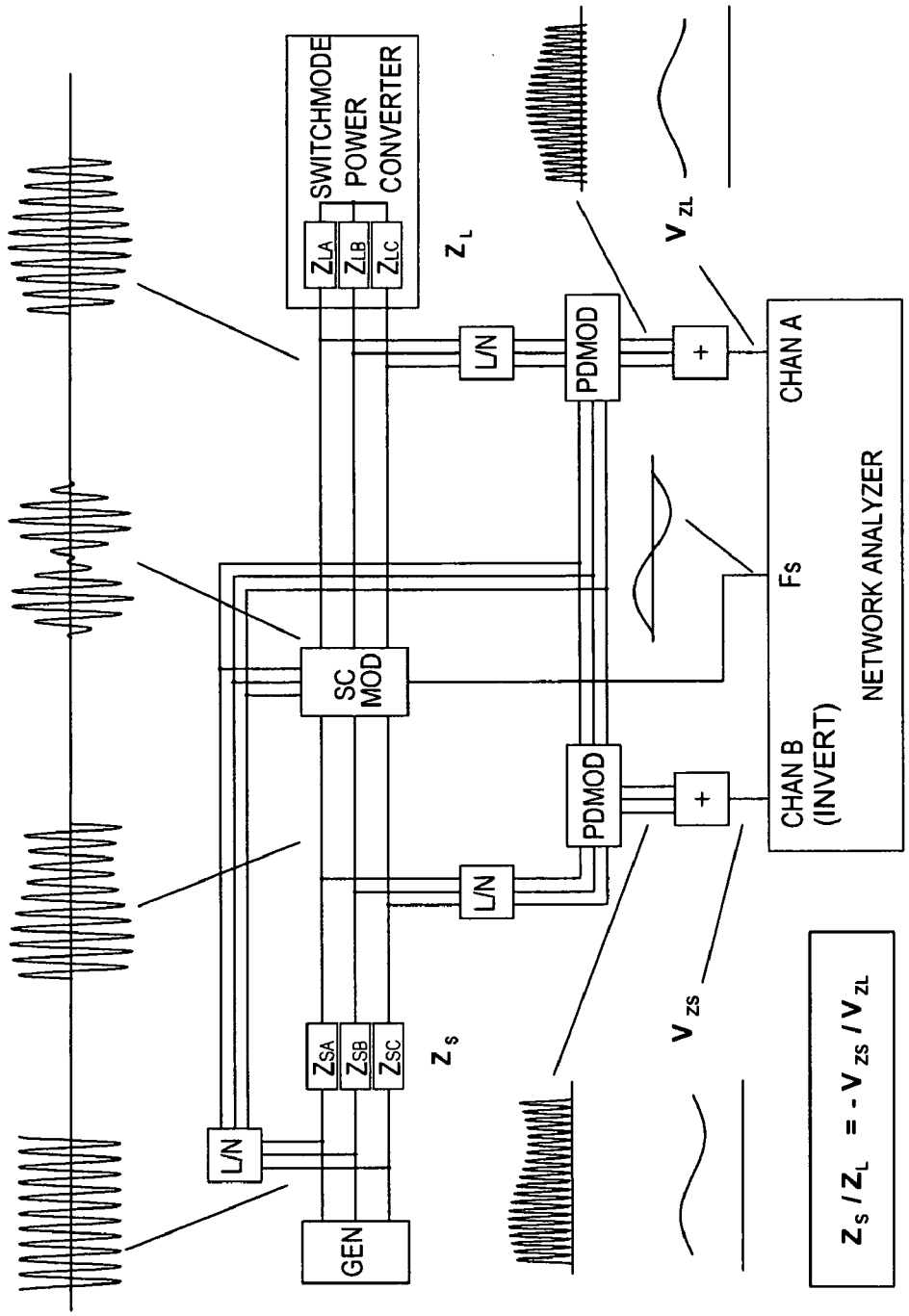
FIG. 5 is a simplified schematic of the method of measuring the margin of stability of a three phase AC system with series injection of suppressed-carrier voltage stimulus.
Figure 6:
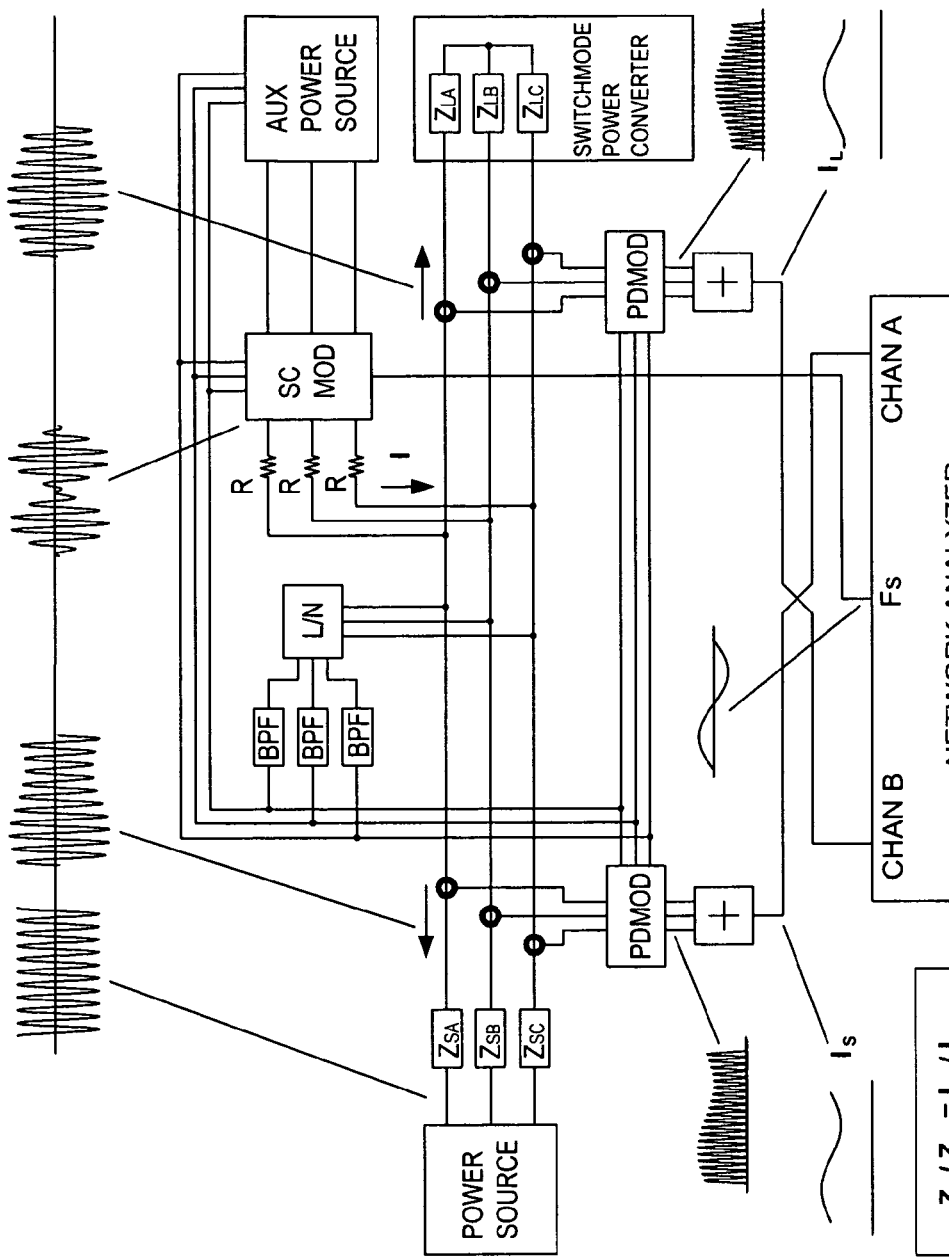
FIG. 6 is a simplified schematic of the method of measuring the margin of stability of a three phase AC system with parallel injection of suppressed-carrier current stimulus.

Fluctuation of the line voltage causes corresponding fluctuation in the output of the product demodulators. If, as in the prior art, the demodulation reference was obtained directly from the line-to-neutral voltage, for example, as shown in FIG. 6, similar fluctuation will also occur in the demodulation reference. A fluctuation of five percent in both the line voltage and the demodulation reference signal would cause a ten percent fluctuation of the DC component at the output of the product demodulator. If the demodulation reference is held constant, as is the case with the PLL reference signal synthesizer, a five percent fluctuation of the line voltage causes only a five percent fluctuation in the DC component at the output of the product demodulator. With a stimulus injection level of less than 0.01 Per Unit, the test frequency component at the output of the product demodulator is less than one percent of the amplitude of the DC component. The constant amplitude demodulation reference produced by the PLL reference signal synthesizer therefore provides a 6 dB reduction in the dynamic range that would be consumed by the DC fluctuations at the input of the network analyzer. A corresponding 6 dB reduction in spectral noise produced by the amplitude fluctuations is also obtained. Although the high-pass filters tend to attenuate the amplitude fluctuations of the DC component, optimum selection of the high-pass filter cutoff frequency for very low frequency stability margin measurements limits the degree of attenuation obtainable.

In a 60 Hz system, for example, the demodulation process also produces a large sum frequency component at 120 Hz. The 120 Hz component has peak values equal to two times that of the DC component. This sum frequency component is cancelled in a balanced 3-phase system. The 120 Hz components produced by the phase A, B and C demodulation processes exist at 120 degrees relative to each other and therefore tend to sum to zero. In a system that is unbalanced, the 120 Hz components do not cancel completely. A small residual 120 Hz component remains. Of more concern are negative and positive sequence harmonics, such as the 5th and 7th. The demodulation process transforms both the 5th and the 7th harmonics into a triplen zero-sequence 6th harmonic. The zero-sequence nature of triplen harmonics causes them to add arithmetically in the summing process. Therefore, modest levels of harmonic distortion of the power system waveforms can produce triplen components at the output of the summation process that are many times larger than the desired test frequency component. The triplen harmonics and the 120 Hz residual component exist at considerably higher frequencies than the subsynchronous oscillation frequencies of interest for power grid stability. Therefore, lowpass filters (LPF1, LPF2, LPF3) are used to eliminate these interfering signals that would otherwise consume a large portion of the dynamic range of network analyzer 20 input channels. One such filter is used for each of the response signals ICT1, ICT3, VBUS.

The three outputs of each demodulator PDMOD block are summed and fed to the highpass filters labeled HPF to remove the DC component. The outputs of the highpass filters are fed to the lowpass filters labeled LPF. Since any inter-unit oscillation is expected to occur at a frequency of 3 Hz or less, the lowpass filters are programmed to have a cutoff frequency of 10 Hz. This filter highly attenuates most of the out-of-band noise, artifacts resulting from harmonic distortion of the power line waveforms and residual 120 Hz component while not inducing excessive phase matching difficulties. The lowpass and highpass filter process reduces the peak-to-peak signal level applied to the network analyzer by eliminating out-of-band energy. This allows network analyzer 20 to operate with DC coupling of the input and a sufficiently high gain to minimize the effects of quantization noise in network analyzer 20. The test frequency FS is swept over a range that somewhat exceeds the 1.5 Hz to 3 Hz range of potential inter-unit oscillation.

In embodiments requiring only two channels, network analyzer 20 may be, for example, a Hewlett Packard® 3563A Control System Analyzer, or equivalent, two-channel Fast Fourier Transform (FFT) analyzer. The Hewlett Packard 3563A analyzer provides a very high quality sinusoidal output signal, in either analog or digital form, at the test frequency, FS. In addition, a suitable four channel analyzer may be used.

In the stability margin measurement associated with FIG. 11, and in the embodiments shown in FIGS. 12-15, network analyzer 20 may facilitate response signal extraction utilizing a two-channel digital Fast Fourier Transform (FFT) processor, having a very narrow bandwidth to discriminate against interference and noise. Over the entire frequency range of interest, network analyzer 20 is capable of providing a very high degree of selectivity. The practical limitation of the narrowness of the analysis bandwidth is the time required for collecting the data record. The nominal resolution, in Hz, of network analyzer 20 is the reciprocal of the length of the data record in seconds. In the intended application, the practical limitation on the narrowness of the analysis bandwidth is determined by two factors: (a) the length of time that system conditions, such as the equipment lineup and loading, can be assumed to remain constant. (b) the desire for "real-time" determination of the stability margin.

Vector averaging is employed in network analyzer 20 to improve the effective signal-to-noise ratio. Network analyzer 20 computes the real and imaginary parts of the impedance ratio used to determine the degree of stability. The real and imaginary parts are averaged separately. As a result, random errors are averaged, over time, toward a zero mean. In this manner, the effect of noise that falls within the analysis bandwidth is greatly reduced.

Network analyzer 20 is set to display the Nyquist diagram of the complex ratio and inverse ratio of the processed response signals ICT1 and ICT3. The display is modified using front panel math operations to display 1+ICT1/ICT3 or 1+ICT3/ICT1. Adding 1.0 to the ratio causes the cursor readout of network analyzer 20 to display the distance from the Nyquist plot to the point −1+j0. The cursor is moved to search for the minimum distance indicating the stability margin. Network analyzer 20 may provide both analog and digital outputs at the test frequency FS. The choice of analog or digital form is dependent upon analog or digital nature of the automatic voltage regulator of the generator to be used for stimulus injection.

Figure 12:
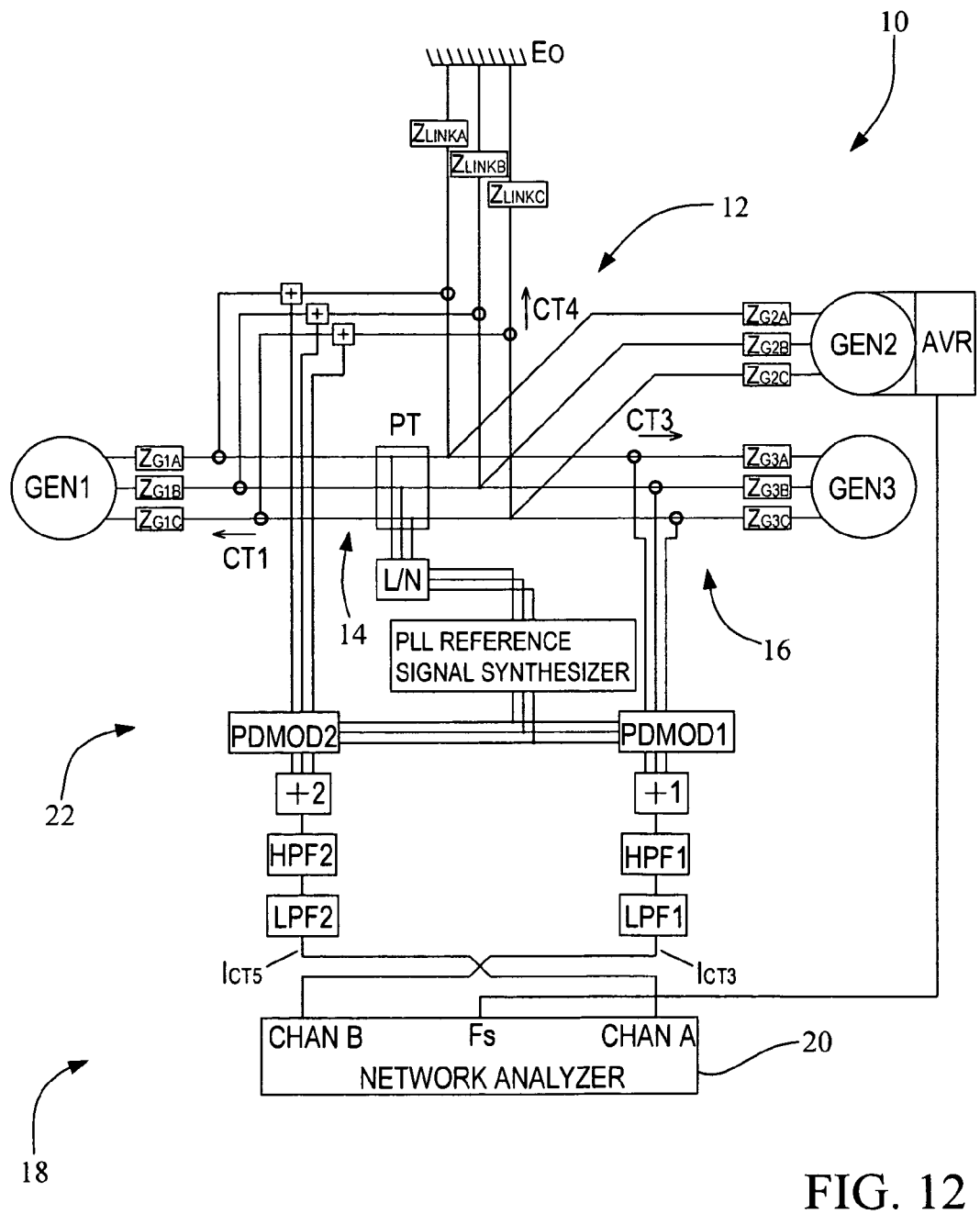
FIG. 12 is a more detailed diagram showing the interconnection for stability margin measurement related to inter-unit oscillation with finite system link reactance and the summation of the output signals of current transformers located at CT1 and CT4 to form the equivalent output to that of fictitious current transformers located at CT5 in FIG. 8.

FIG. 12 illustrates, in more detail, the test configuration of FIG. 8 to measure the stability margin of generator GEN3 operating jointly with generator GEN1 to supply power to the grid under the assumption that the impedance linking these generators to the power system is finite and that generator GEN2 is, in effect but not physically, disconnected. The outputs of the current transformers at CT1 and CT4 are summed in pairs to form the outputs of the theoretical, i.e., fictitious, current transformers at location CT5, shown in FIG. 8. The polarity of the current transformer outputs is chosen to indicate suppressed-carrier current flow in the direction of the arrows. Generator GEN2 serves to inject the suppressed-carrier stimulus current. Network analyzer 20 is set to display the Nyquist diagram of the complex ratio of the processed response signals ICT3 and ICT5. The display is modified using front panel math operations to display 1+ICT3/ICT5. This quantity is known in circuit theory as the Return Difference. Adding 1.0 to the ratio causes the cursor readout to display the distance from the Nyquist plot to the point −1+j0. The cursor of network analyzer 20 is moved to search for the minimum distance which represents the stability margin. At the threshold of instability, the Return Difference is equal to zero.

Figure 13:
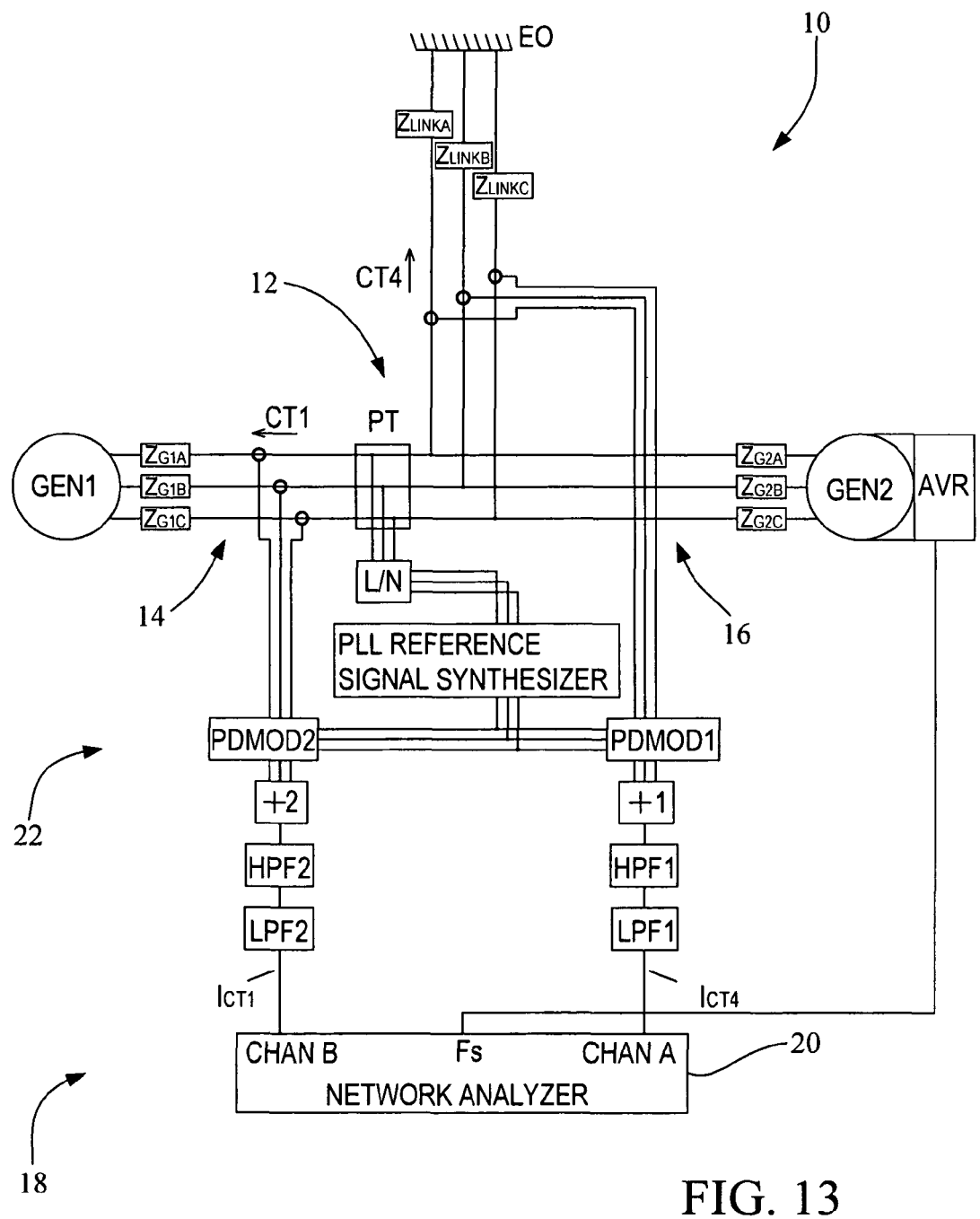
FIG. 13 is a more detailed diagram showing the interconnection for local-mode and inter-area stability margin measurement.

FIG. 13 illustrates, in more detail, the test configuration of FIG. 9 or FIG. 10 to measure the stability margin of the generator, or group of generators, represented by GEN1 with regard to local-mode or inter-area oscillation. Generator GEN2 serves to inject the suppressed-carrier stimulus current. This measurement indicates the stability margin of generator GEN1, assuming that GEN2 is, in effect, not connected the grid. The stability margin of generator GEN1 is determined by the Nyquist plot of the complex ratio ICT1/ICT4. A similar test configuration uses generator GEN1 to inject the suppressed-carrier stimulus and provides a measurement of the stability margin of generator GEN2, assuming that GEN1 is, in effect, not connected to the grid.

The output of a potential transformer PT may be used to sense the voltage response at the point of stimulus current injection. The suppressed-carrier voltage produced by the injected stimulus can be used in conjunction with the sensed current to measure the suppressed-carrier impedance looking into any system component or transmission branch connected to the injection point. VBUS is formed by the summation of the phase A, B and C voltages obtained from the potential transformers PT after demodulation. The suppressed-carrier impedance of the Ith branch is equal to VBUS/ICTi, after appropriate scaling. Knowledge of impedance values allows the determination of the stability margin by a mathematical process and is helpful in determining the cause of low stability margins.

Impedance measurement is particularly useful in determining the stability margin of stand-alone generator installations that do not include other generators that can be employed for stimulus injection. The suppressed-carrier impedance of the generator can be characterized as a function of its kilovolt-ampere (KVA) output and other factors during factory testing, or by measuring an identical generator at a site that has other generators available for stimulus injection. With knowledge of the generator impedance, determination of the stability margin requires only measurement of the impedance, ZLINK, looking into the link that connects the generator to the power grid. The impedance looking into this link will vary as conditions on the power grid change. The stability margin is determined by plotting the Nyquist diagram of the complex ratio ZLINK/ZGEN.

Figure 14:
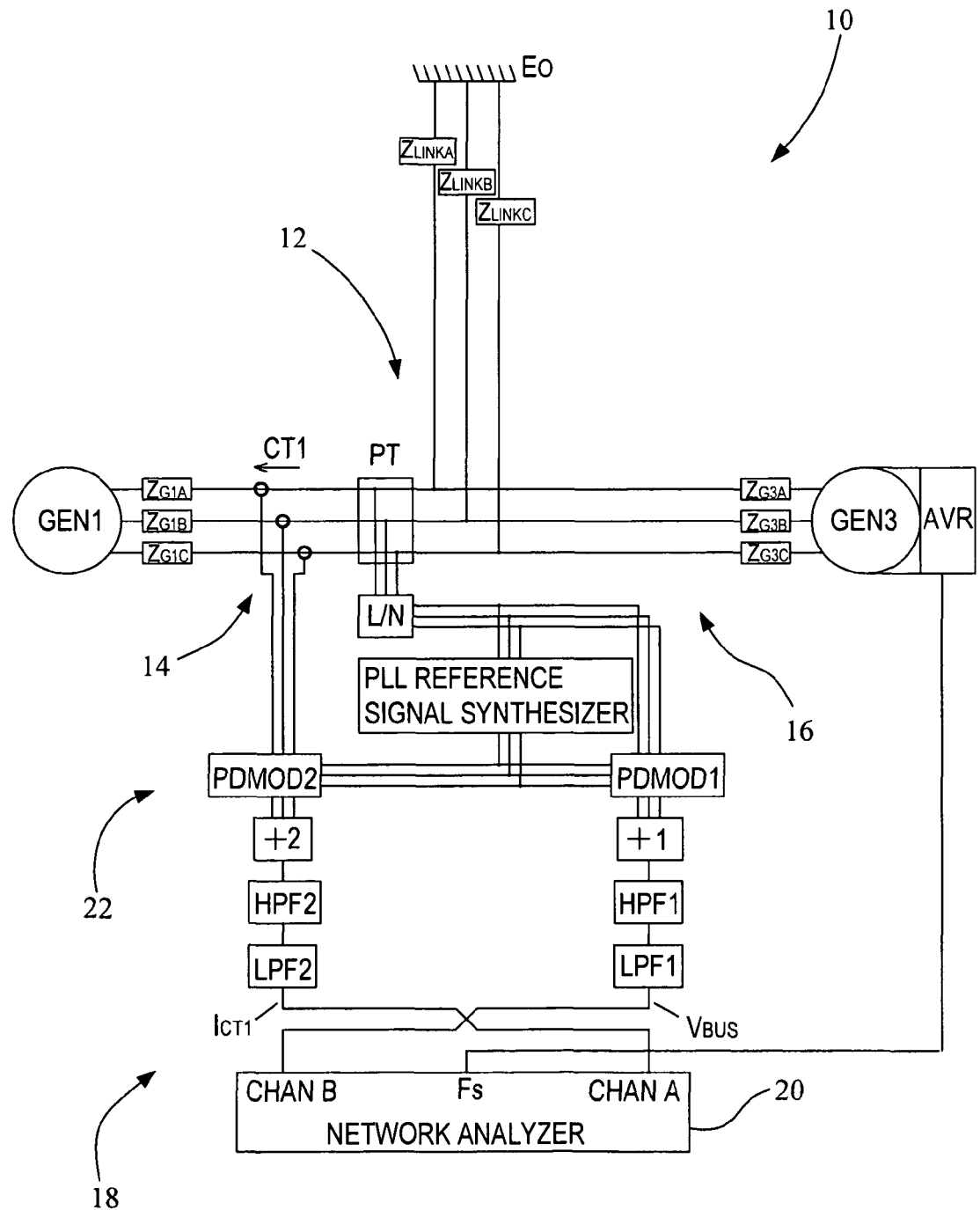
FIG. 14 is a diagram showing the test setup for measurement of the suppressed-carrier impedance of a generator, or group of generators, represented by GEN1.

FIG. 14 is a schematic of the setup for measuring the suppressed-carrier impedance of generator GEN1 or a group of generators represented by generator GEN1. The impedance of this component is determined by the complex voltage/current ratio VBUS/ICT1. The test frequency, FS, is swept over the frequency band of interest to obtain the suppressed-carrier impedance of the generator as a function of frequency. This test configuration can also be used to measure the suppressed-carrier impedance of motors or other components connected to polyphase power grid 10.

Using custom electronic test equipment 22, exploratory measurements on induction motors where performed that showed their incremental input impedance to have a negative-resistance component. The negative resistance existing at the input terminals of the induction motor follows the $Rin=-Vin^2/Pin$ law associated with constant-power loads. At low values of line voltage, Vin, the value of resistance Rin was found to follow this law very closely. At higher voltages, the negative resistance component was present but weaker—having higher values—than the values predicted by the law. The existence of negative resistance values that are weaker than the $-Vin^2/Pin$ law predicts may be the result of magnetic saturation. Adjusting the law as a function of the magnetic saturation curve of the motor may provide an accurate method of modeling the induction motor negative resistance. Induction motors constitute the major portion of national electric power load. It is desirable for the potential contribution of the negative resistance characteristic of the induction motor to oscillatory instability of the power grid to be evaluated and quantified. Synchronous motors are expected to have similar negative impedance characteristics. Custom electronic test equipment 22 facilitates evaluating the negative impedance characteristics of induction and synchronous motors.

Figure 15:
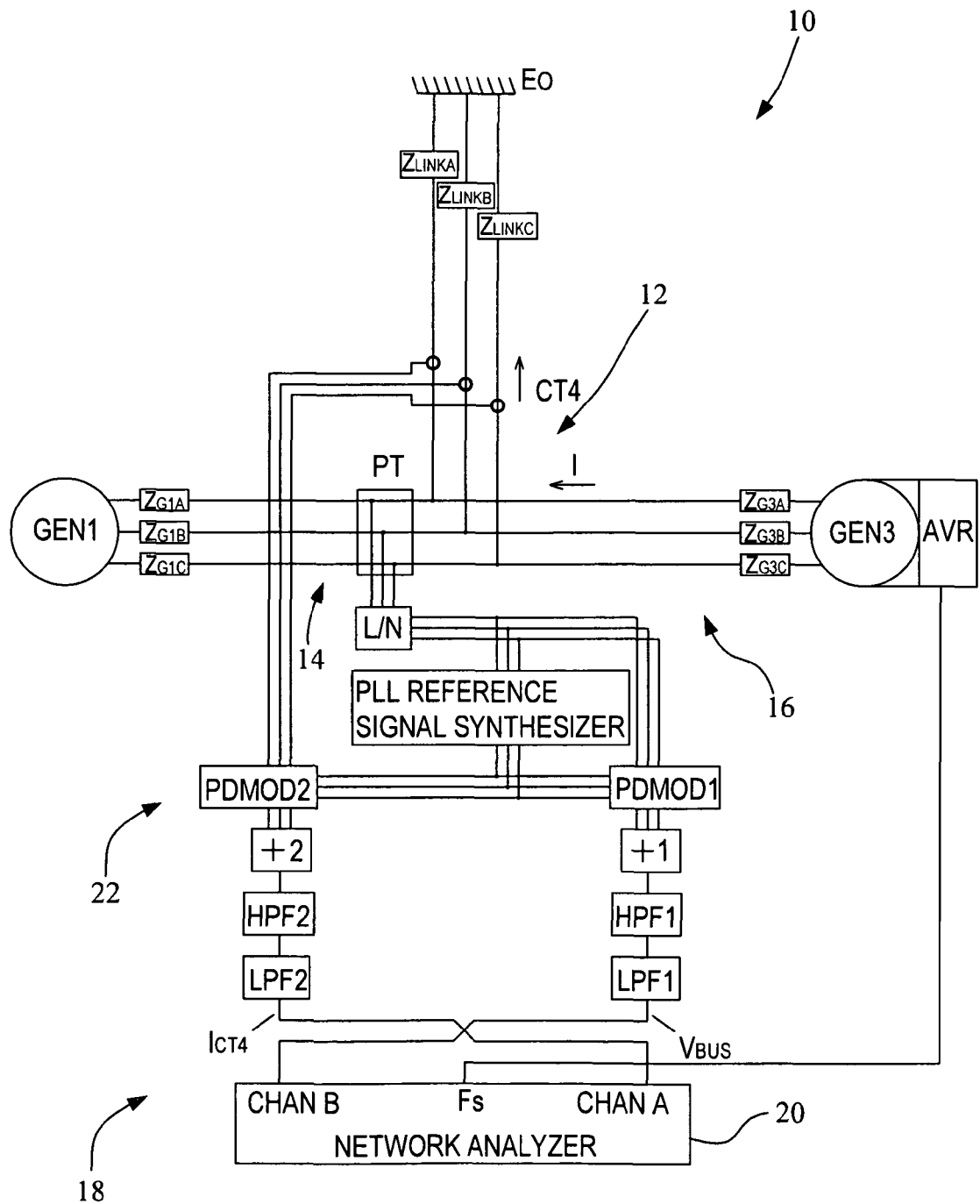
FIG. 15 is a diagram showing the test setup for measurement of the suppressed-carrier impedance of the power system looking into the link connecting the generator station to the power grid.

FIG. 15 is a schematic of the setup for measuring the suppressed-carrier impedance, ZLINK, looking into the link connecting the generator station to polyphase power grid at EO. The impedance of this link is determined by the complex ratio VBUS/ICT4. The methods of suppressed-carrier impedance measurement shown in FIG. 14 and FIG. 15 provide a significant contribution to better modeling of power grid impedance over that provided before the present invention.

Figure 16A:
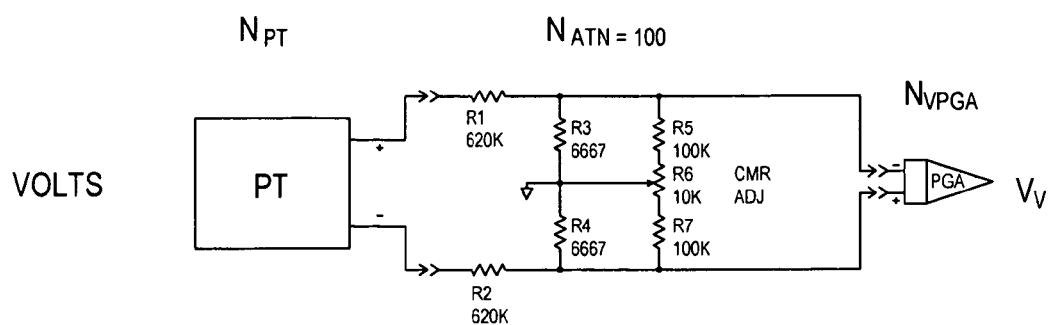
FIG. 16A is a diagram of the scaling elements of a typical voltage channel with a schematic of the voltage attenuator.
Figure 16B:
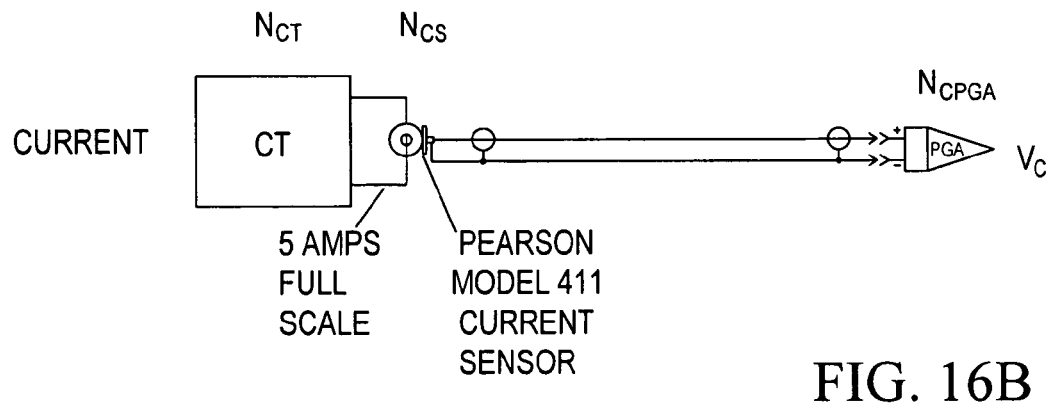
FIG. 16B is a diagram of the scaling elements of a typical current channel with an illustration of the connection of a current sensor.

FIGS. 16A and 16B identify scale factors associated with various components involved in the measurement process. The transmission system line-to ground voltages are obtained from potential transformers (PT) and the line currents are obtained from current transformers (CT). The turns ratios of these transformers introduce the first scale factors. The output of the PT is typically 120 Vrms (volts root mean square) and scales the line voltage by a factor NPT. The output of the potential transformer PT is further scaled by a factor of 100:1 by the attenuator used to make it compatible with the input of the voltage channel programmable-gain amplifier (PGA). The attenuator scale factor is given the label NATN and the PGA gain is labeled NVPGA. The output of the current transformer CT is typically 5 Arms (amperes root mean square) full-scale and the current transformer CT scales the line current by a factor NCT. The current output of the current transformer CT is converted to a voltage, by a current sensor, to make it compatible with the input of the current channel PGA. The gain of the current channel PGA is labeled NCPGA. The operator selects NVPGA and NCPGA to cause the output of the PGA's to be in the range of approximately 2.5 to 5 Vrms to minimize the effects of quantization noise in network analyzer 20 while avoiding any clipping of the output voltages. There may be other scaling operations internal to the custom electronic test equipment 22 that affect the voltage channels and current channels equally and need be of no concern to the operator.

All voltage channels have identical gains and all current channels have identical gains. When stability margins are measured directly, the measurements have the form of volts/volts or amps/amps. In these cases, the scale factors usually are not relevant because the scaling of the two channels is identical. When impedance measurements are made, the measurements are of the form volts/amps and the use of scale factors is essential. The display of network analyzer 20 may be scaled with the use of built-in math functions. For impedance measurements, the displayed data is scaled by the factor NVSCALE/NCSCALE where:

$$NVSCALE=(NPT \times NATN)/NVPGA, \text{ and} \qquad \text{EQ.5}$$

$$NCSCALE=NCT/(NCS \times NCPGA). \qquad \text{EQ.6}$$

Scaling of the test results may also be used to determine the stability margin or impedance for configurations that differ from that which exists in the actual test. It is generally recognized that sub-synchronous oscillation tends to be more likely under conditions of maximum power delivery to the grid.

In the situation such as is shown in FIG. 13, the Nyquist diagrams obtained under the assumption that generators GEN1 is operating alone may show an adequate margin of stability. However, it may be that operating both generator GEN1 and generator GEN2 simultaneously at full power would result in instability. If generator GEN1 and generator GEN2 are identical, the stability margin under the assumption that they are both operating to deliver equal amounts of power can be determined by scaling the amplitude of the Nyquist diagram by a factor of two. The impact of installing additional generators at a given generation station, with regard to local-area oscillation, may be evaluated in a similar manner. Assuming that GEN1 represents N−1 generators currently installed and that the intent is to increase the number of generators to N+M, the Nyquist diagram obtained under the configuration of FIG. 13 may be scaled in magnitude by a factor of (N+M)/(N−1) to predict the stability margin that would exist with N+M generators. In cases where the generators in a group are not identical or not loaded equally, the stability margin can be determined from the ratio of suitably combined suppressed-carrier impedance of the generators and branches involved.

Periodic variation in line voltage causes a variation of light intensity, known as flicker, which can be disturbing to persons subjected to it. Some are more sensitive than others to flicker and in severe cases it is thought to induce physical difficulty. Amplitude modulation of the generators used for suppressed-carrier stimulus injection is expected to be at a level approximately of one percent or less. One-percent voltage fluctuation is approximately at the level that will result in perceptible light flicker with incandescent lamps. This issue is therefore of concern and should be evaluated in the process of measuring the stability margins of the power system as described herein.

There are several mitigating factors that are expected to provide relief of the concern about flicker that may be produced by testing using the method discussed herein:

(1) With the use of the method described herein, the desired stability margin measurements are expected to be obtained with stimulus injection levels well below that which produces perceptible flicker.

(2) The defined threshold of perception for flicker assumes that the voltage amplitude modulation will be of square waveform. The stability margin test method produces sinusoidal modulation of the line voltage which has been determined to be less perceptible than an equal magnitude square wave modulation, or may produce random modulation that may be less perceptible than sinusoidal modulation.

(3) Although the voltage modulation at the generator may be approximately one-percent and therefore nominally at the threshold of flicker perception, the amplitude modulation is expected to attenuate rapidly as it propagates up the transmission link that connects the generator to the power grid and will probably be below the perception threshold before human observers are subjected to it.

(4) Impedance measurements made with the suppressed-carrier methods described herein will lead to a more accurate characterization of the power grid that lead, in turn, to improved modeling and analytical methods of predicting instability with less need for direct testing.

(5) It is anticipated that the application of the subject invention will lead to better understanding of the subsynchronous oscillation problem and therefore to power system designs that are more stable and require less stability margin testing.

Test equipment 18 causes the suppressed-carrier stimulus signal to be injected into a selected power system node, e.g., node 12, extracts the response signals, performs any required signal conditioning, performs demodulation, summation and filtering of the response signals, measures the relative amplitude and phase angle of the demodulated, summed and filtered response signals and displays the resulting Nyquist diagram of the impedance ratio, ZS/ZL.

Custom electronic test equipment 22 includes a hybrid analog-digital reference signal synthesizer that employs phase-locked loops to provide very pure Sine and Cosine reference signals that are phase-locked to the fundamental frequency component of the system line-to-neutral voltages. Pure reference signals are essential to the accurate measurement of stability margins on polyphase power grid 10, e.g., the national power grid at very low levels of stimulus injection. Custom electronic test equipment 22 may facilitate, for example, operation on 50 Hz, 60 Hz and 400 Hz power grids, including the national power grid.

Generation of suppressed-carrier stimulus signals and extraction of system response signals involve modulation and demodulation processes. The ideal modulation/demodulation reference signals would be a set of six pure sinusoidal signals having constant amplitude, three of which are precisely in phase with the fundamental frequency component of the power system Phase A, B and C line-to-neutral waveforms and three that are precisely in quadrature with these waveforms. The existence of noise, harmonics, phase jitter, fluctuations, modulation, etc. in the reference waveforms would tend to degrade the signal-to-noise ratio and may induce a bias error in the stability margin measurement. In order to assure proper phase relationship, the pure references are obtained by processing samples of the line-to-neutral power line waveforms obtained at the power system node where the stability margin is to be measured. These waveforms contain all of the corrupting factors mentioned above. For the intended application of stability margin measurement of the power system, it is expected that the frequencies of potential instability fall within the range of 0.1 Hz to approximately 50 Hz. In the lower portion of the frequency range of interest, bandpass filtering is not suitable for purifying the reference signals obtained from the power lines. To illustrate this point, consider a test frequency of 0.25 Hz. A bandpass filter centered at 60 Hz and having a relatively high Q of 120 would provide only 3 dB attenuation of the noise sidebands existing at 60+/−0.25 Hz. Complicating the problem, bandpass filters having high Q's have very steep phase vs. frequency characteristics. The slightest error in tuning the center frequency would cause an unacceptable phase error in the measurement.

Custom electronic test equipment 22 includes reference waveform synthesizers that phase lock to the fundamental frequency component of the individual line-to-neutral power line waveforms. The output of each reference waveform generator is a synthesized Sine Cosine pair having constant amplitude, precise 90 degree phase displacement, precise in-phase or quadrature alignment with the fundamental frequency component of the phase-to-neutral voltages of the power grid, very low distortion, very low noise and very low phase jitter. The harmonic distortion components of the waveforms should be less than 0.1 percent. Alignment of the in-phase reference with the fundamental frequency component of the line-to-neutral grid voltage should be within 0.5 degrees. The amplitude fluctuations, noise and phase jitter should produce reference waveform purity represented by phase noise of 80 dBc/0.03 Hz over the frequency range of potential subsynchronous oscillation, i.e., 0.1 Hz to 3 Hz, or higher when locked to a stable reference. The phase-lock loop should have a bandwidth of approximately 5 Hz. The hybrid digital/analog reference-waveform synthesizer avoids the difficulties mentioned above. Analog multipliers are used as the phase detectors in order to avoid undesirable phase error and phase jitter resulting from harmonics and noise in the system line-to-neutral waveforms that would occur if a conventional phase detector employing square waves based on zero-crossings were used. With the use of pure sinusoidal reference signals, the analog multiplier phase detector is insensitive to harmonics in the power line waveform and phase-locks only to the fundamental Fourier frequency component of the power line voltage waveform. The phase-locked loop bandwidth needs to be sufficient to track the slow drifts of the power system frequency. The phase-locked oscillator is used to digitally synthesize a twelve-step waveform of precisely constant amplitude. The harmonic content of the step waveform is negligible for the 2nd through 10th harmonic. The 11th and 13th harmonics are down approximately 21 dB and are sufficiently separated from the fundamental to be easily removed by a lowpass filter. The lowpass filter is a 3rd order bi-quad that provides at least 30 dB attenuation for the 10th harmonic and above. The filter has a zero at the 12th harmonic that provides approximately 43 db attenuation at the 11th and 13th harmonic. The total harmonic distortion of the reference signals is approximately 0.1 percent. The nominal phase shift of the lowpass filter at the fundamental frequency is not important because the phase-locked loop forces the output of the filter to align with the fundamental frequency component of the respective line-to-neutral waveform. High precision and matched components are employed in the Sine and Cosine filters to ensure retention of the precise quadrature relationship of these references. The phase vs. frequency slope of the filter response is shallow at the fundamental frequency, resulting in low sensitivity of phase to tuning errors. Three hybrid digital/analog reference signal synthesizers are used to serve the three phases of the power systems.

The above description assumes that the power system is a conventional three-phase system. However, the method is applicable to a power system of any number of phases. For single-phase systems, the process remains similar. However, in single-phase systems, there is no summing process following the demodulation of the response signals. Therefore, cancellation of the double frequency component by summation does not occur. In such single-phase systems, additional filtering may be required following demodulation to adequately suppress the double frequency component. Power systems of more than three phases are employed in large motor drives, such as ship propulsion. The process described above is directly expandable for use in power systems with any number of phases. For such expansion, the Sine and Cosine reference signals would be provided for each of the phases. Stimulus signals would be provided for each of the phases and demodulation of the response signals obtained from each of the phases would be provided. The summation process is similar with expansion to include all of the demodulated response signals involved in the summation.

Custom electronic test equipment 22 includes signal conditioning circuits, modulators for stimulus generation, demodulators for response signal extraction, summers, highpass filters, lowpass filters and hybrid analog/digital reference signal synthesizers. The majority of these functions are contained on the main processor printed circuit board. Three identical processor boards are used to provide the functions necessary for a three-phase system. External connections adjust the personality of these boards. The processor board contains 39 integrated circuits, 56 resistor networks, and assorted discreet resistors capacitors diodes and variable resistors. The use of precise resistor networks ensures gain and phase matching between the phase A, B, and C processor boards. The resistor networks contain resistors that have a one percent tolerance and they are matched typically to +/−0.25 percent or better to provide precise gain matching for the functions. Capacitor values are matched in sets or held to a tolerance of +/−1 percent to provide frequency response matching between the phase A, B and C functions. Variable resistors are employed on the processor board only as adjustments that null any residual offset voltage of the analog integrated circuits. The analog signals are typically intended to operate within a voltage range of approximately 2.5 to 5.0 Vrms. This provides a nominal peak value of 7 volts which is comfortably lower than the clipping level of the integrated circuits at approximately 11 volts. The processor board is designed to be used in a commercial test device that is not only applicable for use in measuring the stability margin at nodes of the national power grid but also the stability margin of other single and polyphase power systems. The present invention may accommodate various power system frequencies, e.g., those operating at 50 Hz, 60 Hz and 400 Hz, etc. As a result, some of the components and functions present in custom electronic test equipment 22 may not be used in all situations.

Figure 17A:
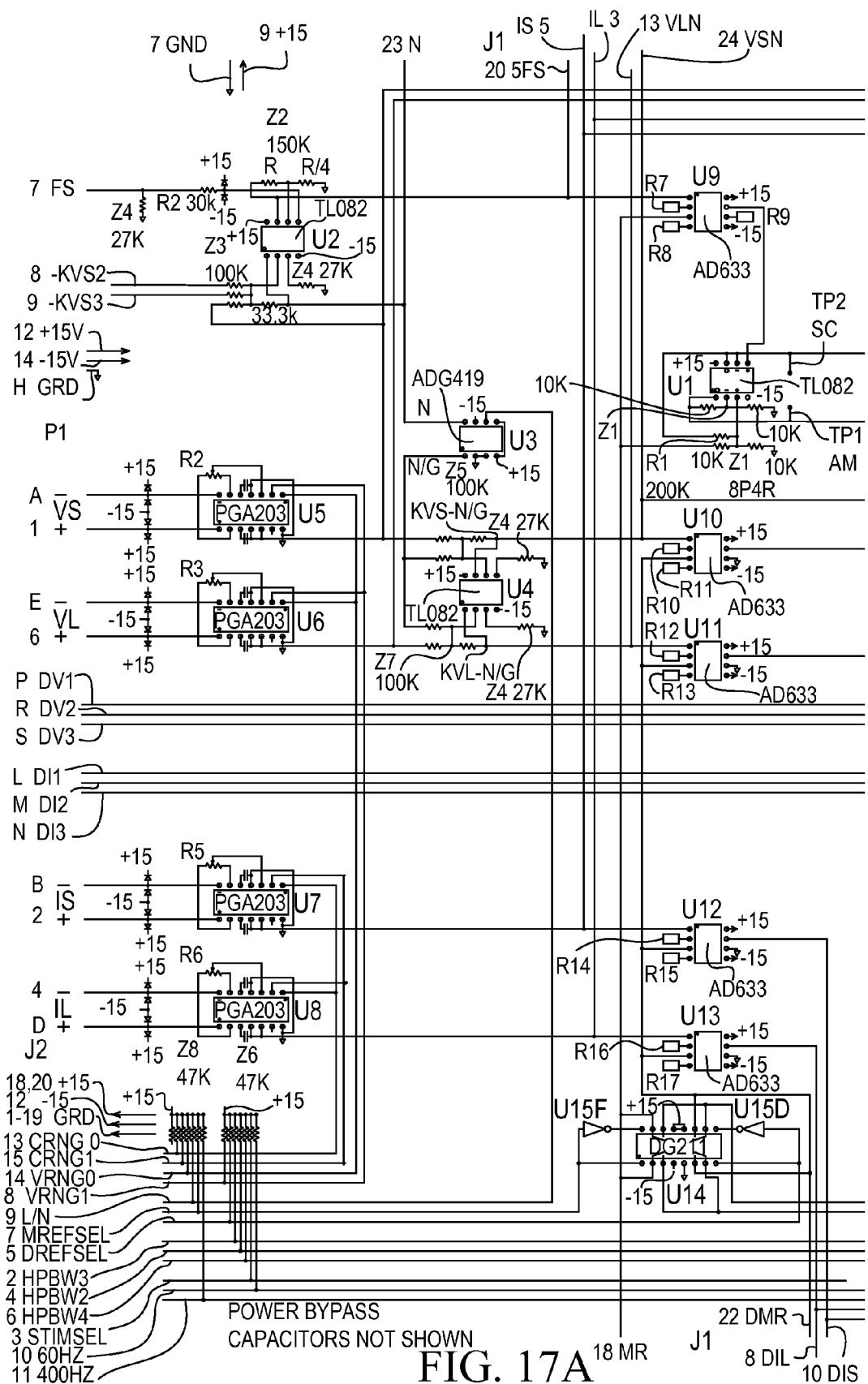
FIGS. 17A, 17B and 17C are sections of a schematic diagram of one of three identical processor printed circuit boards used in the custom electronic equipment.
Figure 17B:
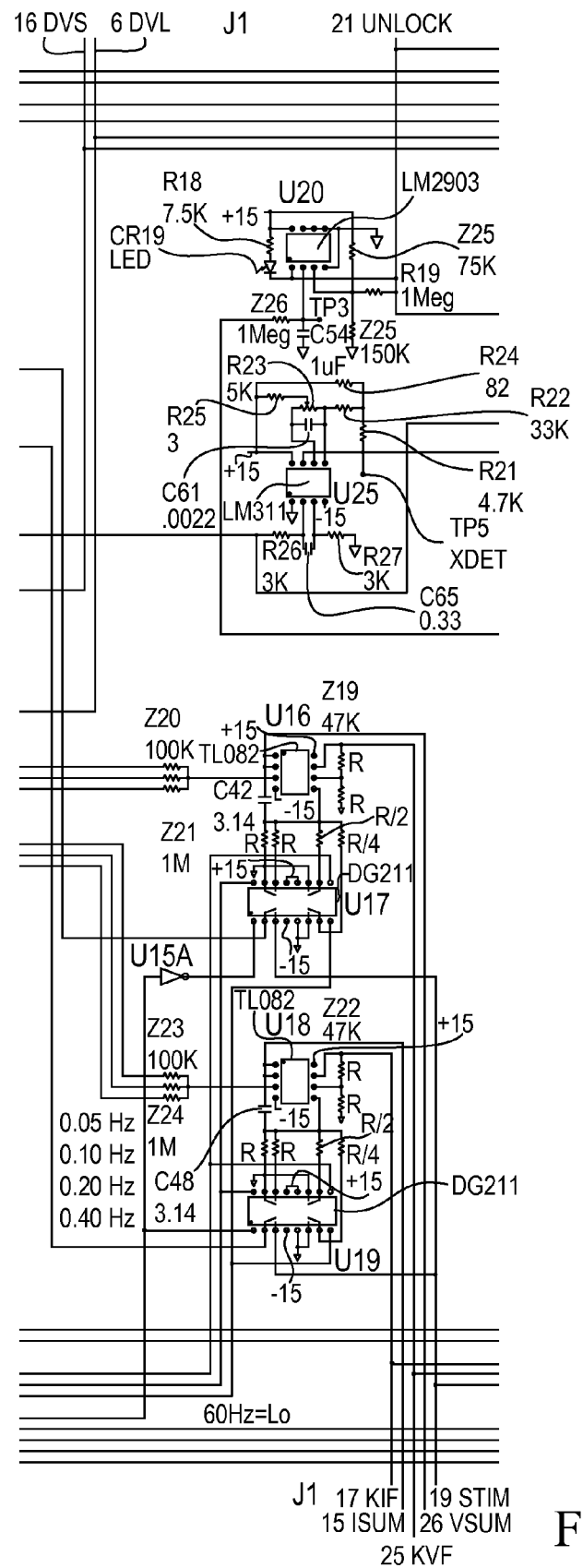
Figure 17C:
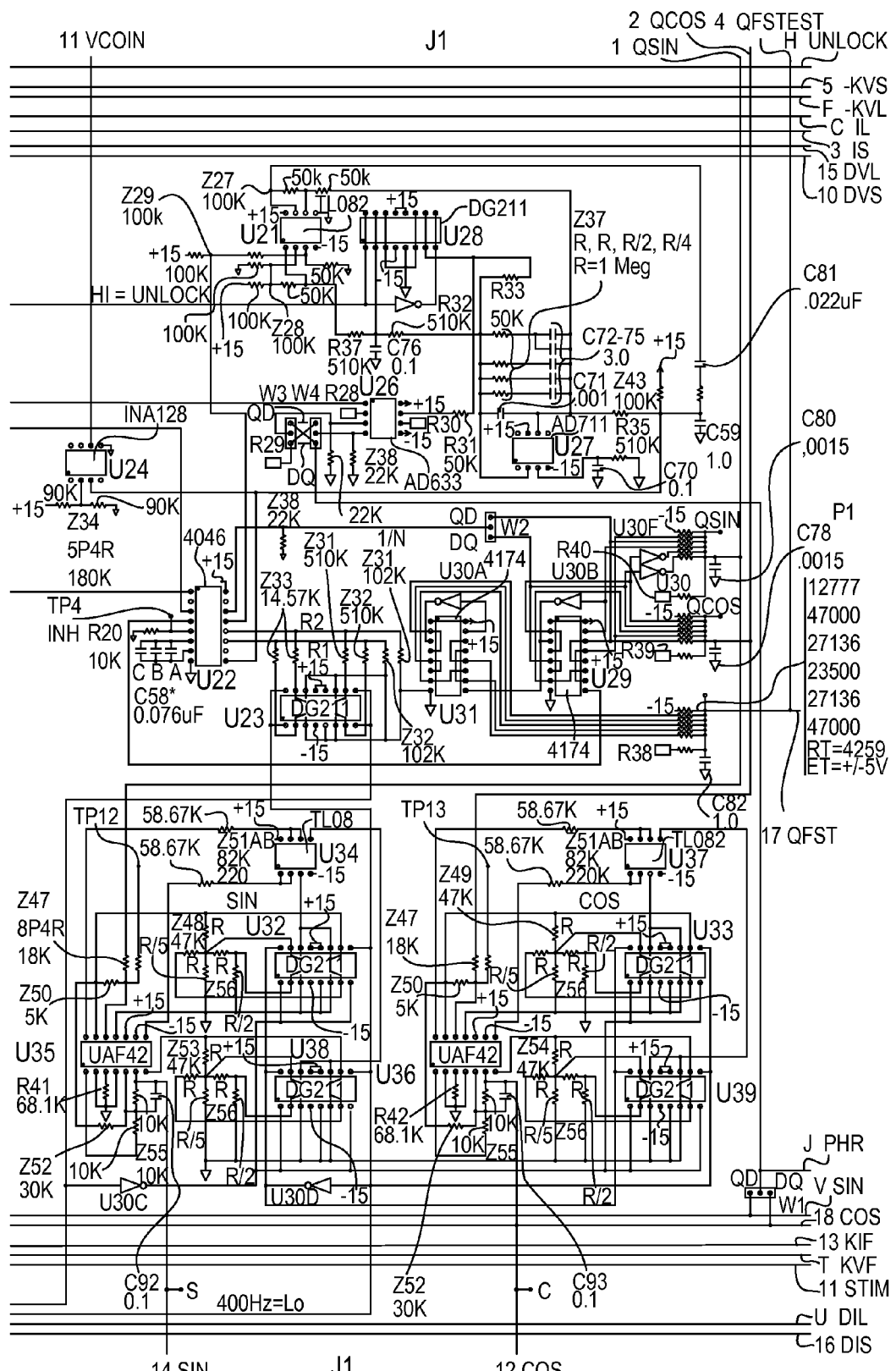

FIGS. 17A, 17B and 17C combine to form a schematic diagram of the processor board. The signals shown at the lower left corner of FIG. 17A, labeled as J2, control the state of the functions. These inputs are logic levels that control the gain, frequency response and modes of operation. The signals on the left side of FIG. 17A are the basic inputs and power connections and the signals on the right side of FIG. 17C are the normal outputs. These signals are labeled P1. The signals shown at the top and bottom, labeled J1, are not required for the basic functions. They are made accessible on the front panel to permit monitoring of the internal signals during the measurement process to ensure that the measurement is not degraded by clipping or by abnormally low signal levels that would result in excessive quantization noise in network analyzer 20. These signals are also available for use in testing and calibration of custom electronic test equipment 22. The integrated circuits are shown as plan views of the package pins with a dot next to pin number one and each is marked with the generic part number.

U2 is a TL082 dual op-amp. The upper half provides a non-inverting gain of 5.0 to raise the nominal 1 volt test frequency signal, FS, to the desired 5 volt level. A diode-resistor network protects the op amp from excessive input voltage. The lower half of U2 forms a three-input inverting summer that computes an artificial neutral point at the centroid of the scaled phase A, B and C voltages.

U5, U6, U7 and U8 are PGA203 programmable gain instrumentation amplifiers. The gain may be set to a value of 1, 2, 4 or 8 by two logic bits. U5 and U6 process attenuated voltage signals VS and VL. The inputs to U5 and U6 are connected to cause the outputs to be inverted, as shown in FIG. 16A. U7 and U8 process voltages representing the currents IS and IL. All of the inputs are protected from overvoltage by diodes. The gain of U5 and U6 is controlled by grounds applied to J2 pins 8 and 14. The gain of U7 and U8 is controlled by grounds applied to pins 13 and 15.

U3 is a DG419 SPDT analog switch that selects either local ground or the neutral signal computed by U2. The switch is controlled by a ground applied to J2 pin 9. This selection causes the processing of the Phase A, B and C voltages to be done on a phase-to-(artificial) neutral or phase-to-ground basis. Use of the artificial neutral is essential for floating delta power system and may improve the effective balance of unbalanced 4-wire power systems.

U4 is a TL082 dual op-amp that re-inverts the inverted VS and VL outputs of U5 and U6. It also combines these signals with the neutral or ground signals selected by U3 to produce VS and VL referenced to the artificial neutral or ground.

U9 is an AD633 analog multiplier. It performs a modulation function. It multiplies the amplified test frequency signal, FS, at the output of U2 by either the Sine or Cosine line frequency reference signal selected by an analog switch contained in U14. This multiplication produces a suppressed-carrier signal, as shown in FIG. 1A, at the output of U9.

U1 is a TL082 dual op-amp. The upper half provides a non-inverting buffer for the suppressed-carrier output signal from U9. The suppressed-carrier output of U1 is present on test point TP2. The lower half of U1 provides a non-inverted summation of the suppressed-carrier output of U9 with either the Sine or Cosine line frequency reference signal selected by an analog switch contained in U14 to produce an amplitude-modulated (AM) signal of approximately five percent modulation. The AM signal is present on TP1. An AM waveform is shown in FIG. 1D.

U10, U11, U12 and U13 are AD633 analog multipliers that demodulate the amplitude-modulated signals obtained via U5, U6, U7 and U8. These signals are multiplied by either the Sine or Cosine reference signal, as determined by the selector switch, U14. U14 is connected to function as a dual SPDT switch. U15 provides inversion of the control logic required by U14. The demodulated outputs are similar to those shown in FIG. 1E.

U16, U17 and the associated resistor networks Z19, Z20 and Z21, and capacitor C42 perform the functions of summation, highpass filtering and amplification. U16 is a TL082 dual op amp. U17 is a DG211 quad SPST analog switch. The demodulated voltage signals, produced by U11 (or U11), for phases A, B and C are summed by three resistors of Z20. The inputs to the summation are labeled DV1, DV2 and DV3. External connections are required to route the input signals. The summation produces an output equal to (DV1+DV2+DV3)/3. This output therefore contains the average value of the desired signal, at frequency FS, contained in these signals. The averaging suppresses any uncorrelated noise, thereby providing an improved signal-to-noise ratio. DV1, DV2 and DV3 also contain large double frequency components at two times the power line frequency +/−FS. These double frequency components have phase relationships of 120 degrees. For a perfectly balanced power system, these double-frequency components sum to zero. For a somewhat unbalanced power system, they do not cancel completely but they are highly attenuated. This cancellation process greatly reduces the amplitude of undesired signal content and allows amplification of the summed signal after the DC component is removed. U16 provides a non-inverting gain of 2.0. Z21 and C42 form a highpass filter that removes the DC. The resistors of Z21 are grouped and selected by three of the analog switches contained in U17 to permit control of the cut-off frequency of the highpass filter by a factor of 1, 2, 4 or 8. The optimum cut-off frequency strongly attenuates very low frequency fluctuations of the DC while not attenuating the desired signal at FS and not introducing significant phase slope that would cause difficulty in phase matching with the highpass filters in the other processor boards. Capacitor C42 and the value of the resistors in the network Z21 are held to an RC time-constant tolerance of +/−2 percent to ensure adequate phase matching of the highpass filters in the Phase A, Phase B and Phase C processors. U18, U19 and the associated resistor networks Z22, Z23, Z24, and capacitor C48 perform similar functions for the demodulated current signals obtained via U7 and U8.

U20 (LM2903), U21 (TL082), U22 (4046), U23 (DG211), U25 (LM311), U26 (AD633), U27 (AD711), U28 (DG211), U29 (4174) and associated components form a phase-locked loop that controls a variable frequency oscillator (VCO) to provide a digital clock that operates at 12 times the power system frequency. This clock is used in the synthesis of the Sine and Cosine reference signals. U22 is an integrated circuit designed to perform the primary functions of a phase-locked loop. It includes a voltage-controlled oscillator, two phase detectors, and a frequency detector. U29 is connected to operate as a ring counter, also known as a Johnson counter. It provides the divide-by-twelve function that causes the VCO to form an N-times clock that operate at twelve times the power system frequency. U26 is an analog multiplier that functions as an analog phase detector. In normal operation, U26 performs the phase detector functions and the digital phase detectors of U22 are not used. The use of the analog multiplier as the phase detector causes the phase detector to be insensitive to harmonic distortion on the power line waveform and to have considerably reduced sensitivity to noise and interference on the input. Digital phase detectors operate on the zero crossing of the input signal, making them highly sensitive to harmonics and noise on the input. With such zero crossing phase detectors, harmonics and periodic noise can produce an erratic shift in the point of zero crossing that would result in unacceptable phase noise and phase bias error. U27 is an op-amp that serves as an integrator that forces the phase-locked loop to operate with zero phase error in the steady state. Capacitors C71-C75 are placed in the feedback path to produce the integration. The resistors of Z37 provide shaping of the loop amplitude and phase response to stabilize the feedback loop. A resistor of Z43 and C59 form a lowpass filter to help attenuate the residual double-frequency component in the U27 output. U21 is a dual op-amp. The upper half of U21 forms a unity gain inverted version of the output of U27. This output of U21 is fed back to C59 via C81. C81 removes the DC component. Feedback of the inverted integrator output produces partial cancellation of the double-frequency component of the phase detector in the VCO control voltage, thereby contributing to the purity of the Sine Cosine reference signals. U23 is a quad SPST analog switch that controls the effective value of the resistors of Z30, Z31, Z32 and Z33. The effective value of the resistors set the center frequency and tuning span of the VCO for optimizing the performance on 50 Hz, 60 Hz and 400 Hz power systems. The switches are controlled by logic levels on J2 pin 10 and pin 11.

The very low bandwidth of the phase-locked loop would result in an extremely long time required for the loop to capture and lock onto the input signal. To obtain a short capture time, the frequency detector of U22 is employed to quickly force the VCO to the correct frequency. When frequency lock has been achieved, the mode of the phase-locked loop is switched to operate in its normal fashion, using the analog multiplier as the phase detector. Pin 1 of U22 provides a logic level that serves as an indicator of frequency lock. Pin 1 is a logic HI when frequency lock exists, but pulses to logic LO when the frequency is not locked. This signal is fed to the circuit of Z26 and C54 that form a lowpass filter. Z25 forms a voltage divider that sets a decision threshold for comparator U20. When the voltage on C54 falls below 10 volts, a logic HI UNLOCK signal is generated. R19 provides hysteresis for this decision to prevent chatter.

U28 forms a pair of SPST analog switches. Each of the two switch functions employ two switches in parallel to provide a lower ON resistance. In normal mode of the phase-locked loop, analog switches of U28 short C76 to ground. With C76 shorted, any input to the U27 summing junction through R37 and R32 is negligible and U26 provides the phase error signal to the integrator via R31 and R33.

In the UNLOCK condition, the short across C76 is removed. The digital phase detector output at pin 13 of U22 is employed to drive the VCO to the proper frequency. The output at pin 13 consists of positive or negative pulses that indicate positive or negative frequency error. These pulses are centered about 7.5 volts DC. The lower half of op-amp U21 and the resistors of Z28 and Z20 provide a non-inverting level shift of these pulses to cause them to be centered about zero volts. The level shift is needed to make the error signal compatible with the input of U27. U25 is a comparator configured to operate as a zero-cross detector. It converts the sinusoidal output of U4 to a square-wave logic signal that is compatible with the frequency detector input of U22. A square wave is also taken from U29 and applied to the other input of the U22 frequency detector. When frequency lock has been achieved, U20 pulls UNLOCK to logic LO causing the phase-locked loop to revert to normal operation.

U29, combined with three inverters of U30 and associated resistor networks, provide the basic waveform generation functions for the synthesized Sine and Cosine references. These logic elements are CMOS technology, which provide logic HI output levels that are equal to the well regulated +15 volt supply or logic LO at 0 volt ground. The divide by twelve operation of U29 produces five symmetrical square waves, at the power system frequency, that are phase shifted in increments of 30 degrees. Resistor networks providing resistance values of 47K, 27.136K, 23.5K, 27.136K and 47K ohms are connected, respectively, to the sequentially phase shifted square waves of U29. The resistors provide a weighted summation of the square waves to produces a step waveform that approximates a sinusoid. An additional resistor of 12.77K is connected to −15 volts to remove an offset of 7.5 volts to center the waveform about zero volts. The waveform contains 11th and 13th harmonics and some of higher order, but no lower order harmonics. The 11th and 13th harmonics are approximately 23 dB below the fundamental frequency component. Two such summations are formed, one for the Sine and one for the Cosine. The Sine output is formed using square waves that are offset by 90 degrees, or three stages, from those used for the Cosine. Inverters U30E and U30F provide the additional 180 degree phase shifted square waves required for the Sine output. The remaining harmonics are removed by lowpass filters formed by U35 and U36 having an attenuation of 30 dB or more for all frequencies above the 10th harmonic and having a zero at the 12th harmonic that provides more than 40 dB of attenuation of the 11th and 13th harmonic. The total harmonic distortion of the Sine and Cosine references at the filter output is approximately 0.1 percent. The amplitude is proportional to the well regulated 15 volt supply thereby providing the desired constant amplitude. C78 and C80 are included to slow the rise time of the stepped waveforms to minimize crosstalk on the board. These capacitors also provide additional attenuation of the 11th, 13th and higher harmonics. The gain of the lowpass filters is set to provide the Sine and Cosine outputs at 7 Vrms. Because these references have constant amplitude, there is no need to provide extra headroom at the inputs of the circuits that use these signals. The 10 V peak value of the Sine and Cosine references cause the output of U9, U10, U11, U12 and U13 to retain the nominal 7 V peak output level when their input signal is 5 Vrms The lowpass filters are re-tuned for optimum performance for power system frequencies of 50 Hz, 60 Hz and 400 Hz. Re-tuning is performed by altering the effective resistance of 58.67K feedback resistors contained in Z47. The effective value of resistance is changed by feeding back an attenuated version of the signal normally employed. Without the attenuation, the filters are optimized for 400 Hz. For 60 Hz operation, the attenuators are set to feed 0.150 times the normal signal. For 50 Hz, the attenuators are set to feed 0.125 times the normal signal. The attenuators are formed by Z48, Z49, Z53, and Z54 in conjunction with portions of Z56. Analog switches U32, U33, U38 and U39 control the feedback ratio. U34 and U37 are TL082 dual op amps that serve as unity gain buffers for the feedback dividers. The state of the switches is determined by logic grounds applied to J2 pins 10 and 11.

U24 is an INA128 instrumentation amplifier. It is not involved in any of the signal processing functions. It is included to provide a buffered replica of the VCO control signal for monitoring. A voltage divider, formed by Z32, provides an offset to center the U24 output about zero volts.

Jumper W1 selects either of the two reference waveforms to be applied to the analog phase detector, U26. The position of this jumper and associated jumpers W3 and W4 determine whether the direct axis reference will lead or lag the in-phase (quadrature axis) reference. The jumper W2 determines which square-wave reference is used for frequency lock. The choice of the W2 position affects only the time required to transition from frequency lock to phase lock.

Figure 18:
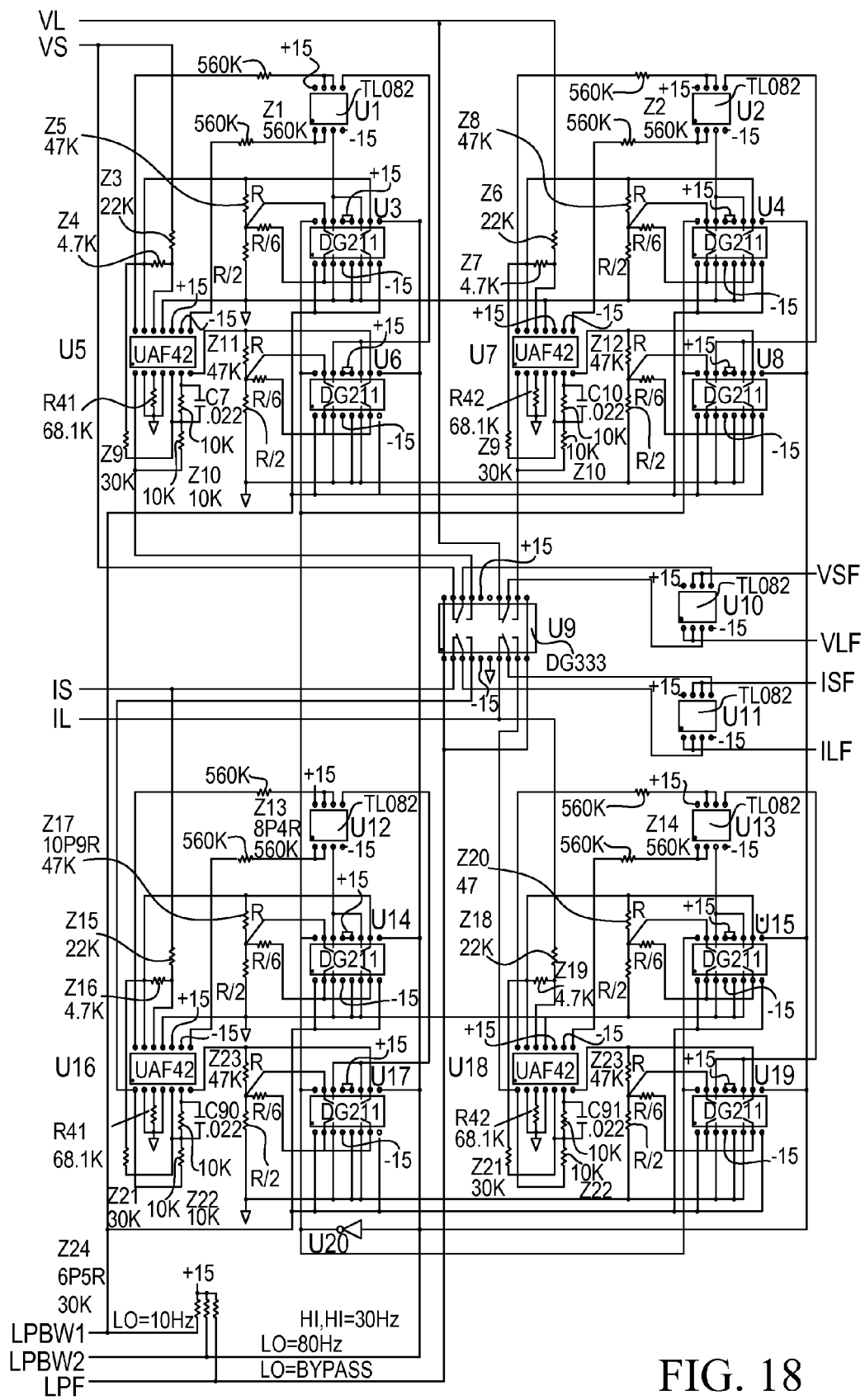
FIG. 18 is a schematic diagram of the lowpass filter board.

FIG. 18 is the schematic of the lowpass filter board. There are four identical lowpass filters that are similar to those used in the reference signal synthesizer on the processor board. The bandwidth of the filters is programmable to provide cut-off frequencies of 10 Hz, 30 Hz or 80 Hz. These filters may be used to eliminate harmonics, out-of-band noise and interference when measuring the stability margin of the power system, wherein the frequency of minimum stability margin is expected to occur at low frequencies. Any harmonic or residual double frequency component at the output of the sum process is effectively removed by the use of these filters. The filter bandwidth is controlled by the LPBW1 and LPBW2 logic inputs shown at the lower left corner. Logic LO on the LPBW1 input selects the 10 Hz bandwidth. Logic LO on the LPBW2 input selects the 80 Hz bandwidth. Logic HI on both inputs selects the 30 Hz bandwidth. U9 is a 4PDT switch that selects or bypasses the lowpass filters. Logic LO on the LPF input causes the filters to be bypassed. U10 and U11 (TL082) are dual op-amps that provide unity gain buffers for the outputs of the lowpass filter board.

Figure 19:
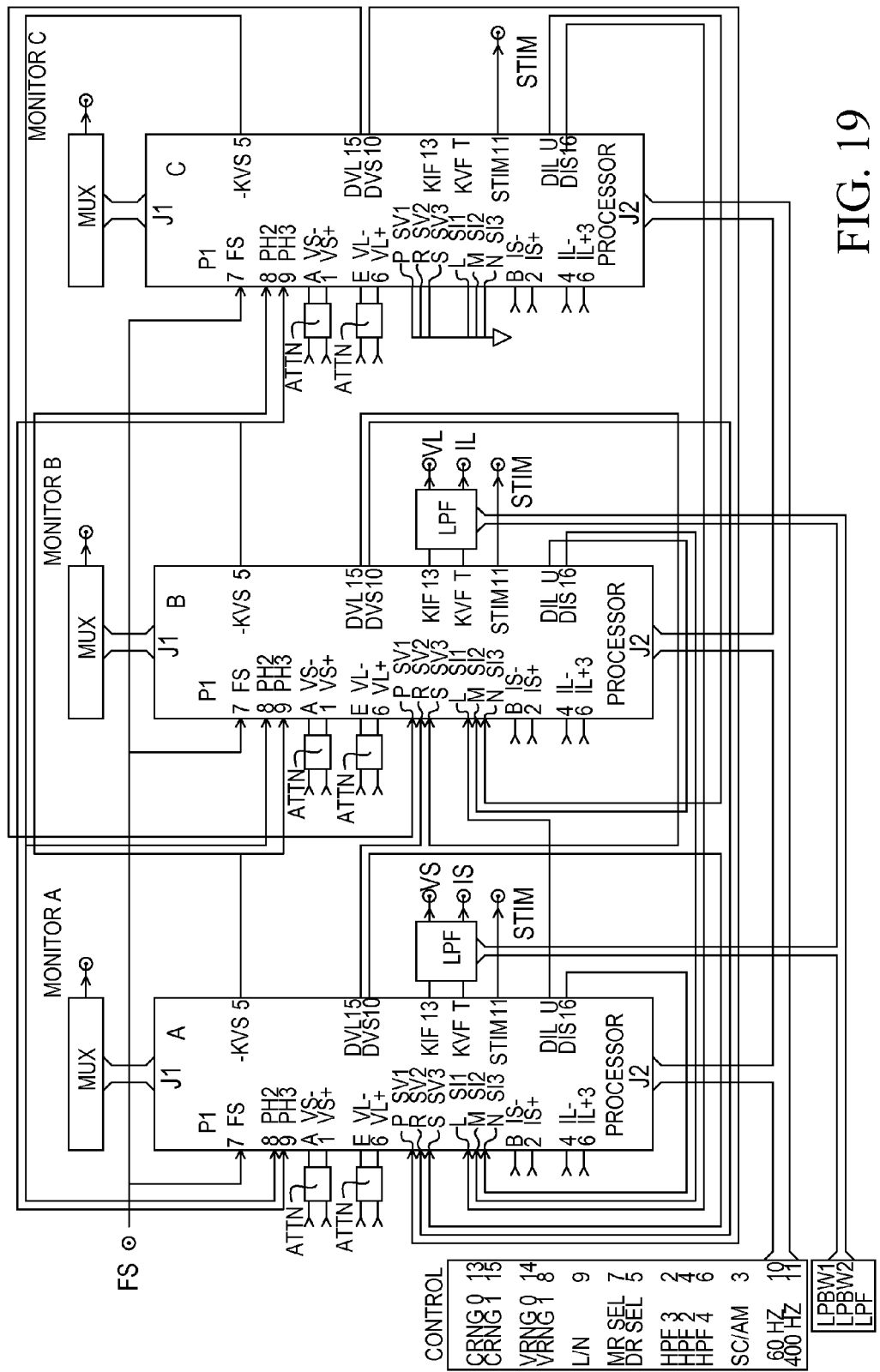
FIG. 19 is a block diagram of the custom electronic test equipment showing board interconnection.

FIG. 19 illustrates custom electronic test equipment 22 in block diagram form, which provides outputs to a suitable four channel version of network analyzer 20. Three identical processor boards are used. The processor boards, lowpass filter board and the attenuators are interconnected as shown to perform the required functions. The control signals are shown in the lower left corner. These inputs control the status and operating modes of the equipment. The control inputs of all three processor boards are connected in parallel and applied to the boards via J2. Pull-up resistors are provided on the boards.

For a 60 Hz power system frequency logic LO is applied to pin 10 of J2. For a 400 Hz system frequency, logic LO is applied to pin 11. For a 50 Hz system frequency, pins 10 and 11 are set to logic HI. These logic inputs re-tune the center frequency and the tuning span of the phase-locked loop VCO. They also re-tune frequency response of the 3rd order lowpass filters employed in the reference signal synthesizers for minimum harmonic distortion of the reference signal outputs.

The gain of the programmable input amplifiers is controlled by logic inputs. Gain values of 1, 2, 4 or 8 may be selected. The gain of the two voltage channels is set by logic levels on pins 8 and 14. The gain of the two current channels is set by logic levels on pins 13 and 15.

There are four summation-highpass-filter functions required. Each processor board contains two such circuits. The summation circuits on processor board A are used to process the VS and IS signals and those on board B are used to process the VL and IL signals. The corresponding circuits on board C are not needed and their inputs are grounded. The cutoff frequency of the highpass filters is set by logic levels on J2 pins 2, 4 and 6. Cutoff frequencies of 0.05, 0.10, 0.20 and 0.40 Hz are selectable. For 0.05 Hz, logic HI is applied to all three pins. For 0.1 Hz, logic LO is applied to pin 4. For 0.20 Hz, logic LO is applied to pins 2 and 4. For 0.40 Hz, logic LO is applied to pins 2, 4 and 6.

Logic LO on pin 9 causes the input voltages to be processed relative to an artificial neutral point. Logic HI causes the input voltages to be processed relative to the ground reference applied to the VS inputs. Logic LO applied to pin 3 causes the stimulus signal at the STIM output on pin 11 of the processor boards to be in suppressed-carrier form. Logic HI causes these outputs to be in amplitude-modulated form.

FIG. 16A is a block diagram showing the interface of a typical voltage input channel connected to the output of a potential transformer (PT) that exists as a part of the transmission system instrumentation. It also includes a schematic of the 100:1 voltage attenuator required to reduce the 120 volt output voltage of the PT to a level compatible with the PGA input. R6 provides an adjustment to maximize the common-mode rejection ratio (CMRR) of the attenuator. All resistors have a 1 percent nominal tolerance. Resistors R1 and R2 and resistors R3 and R4 are matched to 0.25 percent or better. The polarity of the output voltage of the attenuators is reversed at the input of the programmable gain amplifiers to produce the proper phase at the output of U4 on the processor boards. FIG. 16B shows the interface of a typical current channel. A current sensor, such as a Pearson model 411 current sensor, converts the 5 ampere full-scale output of the current transformer to a voltage with a 0.1 volt per ampere ratio to make the current signal compatible with the programmable input amplifier of the current channel.

There are numerous basic designs of automatic voltage regulators (AVR), and various optional features selected for particular installations. By its nature, each of the designs has the inherent ability to vary the generator excitation and thereby provide for amplitude modulation of the generated voltage required for injection of the suppressed-carrier stimulus current. The details of the modification must be determined on a case-by-case basis.

In accordance with another aspect of the invention, a D-Q impedance matrix may be used to define the impedance of components such as motors and generators in a manner that adequately describes impedance as a function of frequency and variation of impedance as a function of phase angle. For the purposes herein, the positive D axis is defined as leading the Q axis by 90 degrees and the Q axis is assumed positioned at zero degrees. The choice of convention is somewhat arbitrary. However, the choice is made to be consistent with the normal convention used in circuit analysis and to be consistent with the convention employed in the network analyzer as further described below. It is noted that ANSI/IEEE Std 100-1977 defines the D-Q axis orientation such that the Q axis leads the D axis by 90 degrees. This ANSI/IEEE convention is logical for analysis of generators and motors; however, the axis definitions are different for generators and motors and the respective sets of axes are offset from each other by the sum of the generator and motor power angles.

In accordance with the present invention, for stability analysis of power systems that may contain both motors and generators, it is reasonable and convenient to treat the system components as black boxes defined by D-Q impedance, rather than as purely motors and generators, and to employ the standard circuit analysis convention wherein the j axis leads the real axis by 90 degrees.

The D-Q impedance matrix contains four impedance parameters: Zqq, Zqd, Zdq and Zdd that are functions of frequency. Equations (7) and (8), that follow below, involve the four unknowns, impedance parameters Zqq, Zqd, Zdq and Zdd, in terms of a complex representation of voltage (V) and current (I).

$$Vq = Zqq\, Iq + Zqd\, Id \qquad \text{Equation (7)}$$

$$Vd = Zdq\, Iq + Zdd\, Id \qquad \text{Equation (8)}$$

wherein: V=Vq+jVd, with Vq being the real portion of V and Vd being the imaginary portion of V; and
I=Iq+jId, with Iq being the real portion of I and Id being the imaginary portion of I.

Under ideal conditions, the unknown D-Q impedance values Zqq, Zqd, Zdq and Zdd theoretically could be measured directly by setting either Iq or Id to zero; however, in most cases, this is not possible or practical to do so. Therefore, the unknown D-Q impedance values Zqq, Zqd, Zdq and Zdd are determined from simultaneous solution of a set of four independent equations. As further explained below, voltages Vq and Vd and currents Iq and Id are obtained from measurement.

Figure 20A:
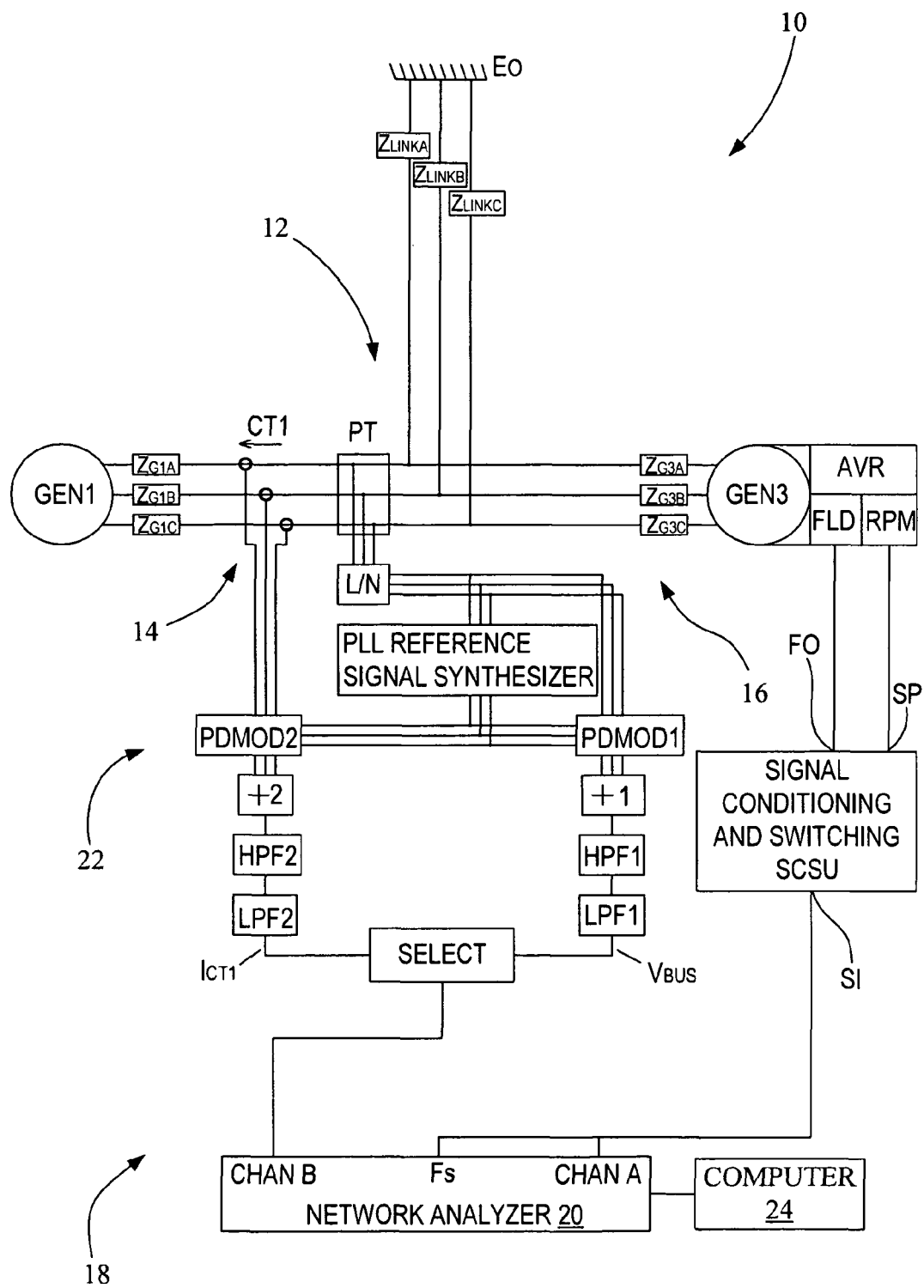
FIG. 20A is a diagram showing a test setup for measurement of the D-Q impedance of a generator, or group of generators, represented by GEN1.

FIG. 20A illustrates an exemplary test configuration that may be used to determine the D-Q impedance values Zqq, Zqd, Zdq and Zdd associated with generator GEN1, by making the necessary voltage and current measurements under different stimulus current conditions needed to form the four independent equations. FIG. 20A is a modification of FIG. 14, and corresponding reference characters indicate corresponding parts, unless otherwise described.

For the purposes herein, when a generator is used as a stimulus current source, the term generator is intended to mean any device connected to the power grid that is capable of being controlled in such a manner that it will cause a stimulus current to be injected into the node to which it is connected, with that stimulus current being of suppressed-carrier form and controlled such that its phase relation to the node voltage may be aligned to be in a first case, for example, predominantly in-phase and, in a second case predominantly in-quadrature with the phase of the first case, to produce a set of response signals that are substantially independent in the mathematical sense. Such devices may include, but not be limited to: rotary synchronous generators, rotary synchronous capacitors, rotary synchronous motors, electronic switchmode power converters and electronic variable speed drives.

Referring to FIG. 20A, generator GEN3 is connected to a node of a reasonably stiff power grid. A signal conditioning and switching unit SCSU includes a field output FO, a speed output SP, and a test frequency input SI. The automatic voltage regulator AVR of generator GEN3 includes a field input FLD and a speed input RPM. The field output FO of signal conditioning and switching unit SCSU is electrically coupled to field input FLD of automatic voltage regulator AVR. The speed output SP of signal conditioning and switching unit SCSU is electrically coupled to the speed input RPM of automatic voltage regulator AVR. The stimulus input SI of signal conditioning and switching unit SCSU is electrically coupled to network analyzer 20 to receive a test frequency signal, FS, which also is tied to channel A (CHAN A) of network analyzer 20. In the present embodiment, the test frequency signal, FS, is sinusoidal, but it is contemplated that other waveforms may be used. A computer 24 is communicatively coupled to network analyzer 20. In the present embodiment, network analyzer 20 is a single two-channel network analyzer, such as for example, an Hp3563A network analyzer from Hewlett-Packard, Co.

In general, as more fully described below, with a stimulus voltage applied to the speed input RPM of the automatic voltage regulator AVR of generator GEN3, a suppressed-carrier current is caused to flow into grid node 12 at a phase angle that is approximately aligned with the Q axis, and the complex voltage components Vq and Vd and complex current components Iq and Id are measured to form a first set of two equations in accordance with Equations (7) and (8). The signal conditioning and switching unit SCSU then applies the stimulus voltage to the field input FLD. This causes the phase angle of the stimulus current to be approximately aligned with the D axis, and the complex voltage components Vq and Vd and the complex current components Iq and Id are again measured to form a second set of two equations in accordance with Equations (7) and (8). In order to ensure a high degree of independence between the two sets of equations, the second stimulus current should be approximately in quadrature with the first stimulus current. The process described above, involving the use of the RPM and FLD inputs to the AVR, ensures a high degree of independence by providing an approximate quadrature relationship of the first and second stimulus currents.

In the present embodiment, for example, signal conditioning and switching unit SCSU may contain only a switching relay to selectively apply the stimulus voltage, i.e., test frequency signal, Fs, to speed input RPM of automatic voltage regulator AVR to establish a first stimulus current condition, or to the field input FLD of automatic voltage regulator AVR to establish the second stimulus current condition in quadrature with the first stimulus current. However, if system nonlinearity due to current variations at the speed input RPM and/or field input FLD is of concern, the signal conditioning and switching unit SCSU may be modified to include predistortion circuitry that will tend to compensate for the system nonlinearity.

A switch circuit SELECT is electrically coupled to low pass filter LPF1 and low pass filter LPF2 to selectively receive voltage signal VBUS (bus voltage) and current signal ICT1 (bus current), respectively. Switch circuit SELECT provides the selected voltage signal or current signal to channel B (CHAN B) of network analyzer 20.

Figure 21A:
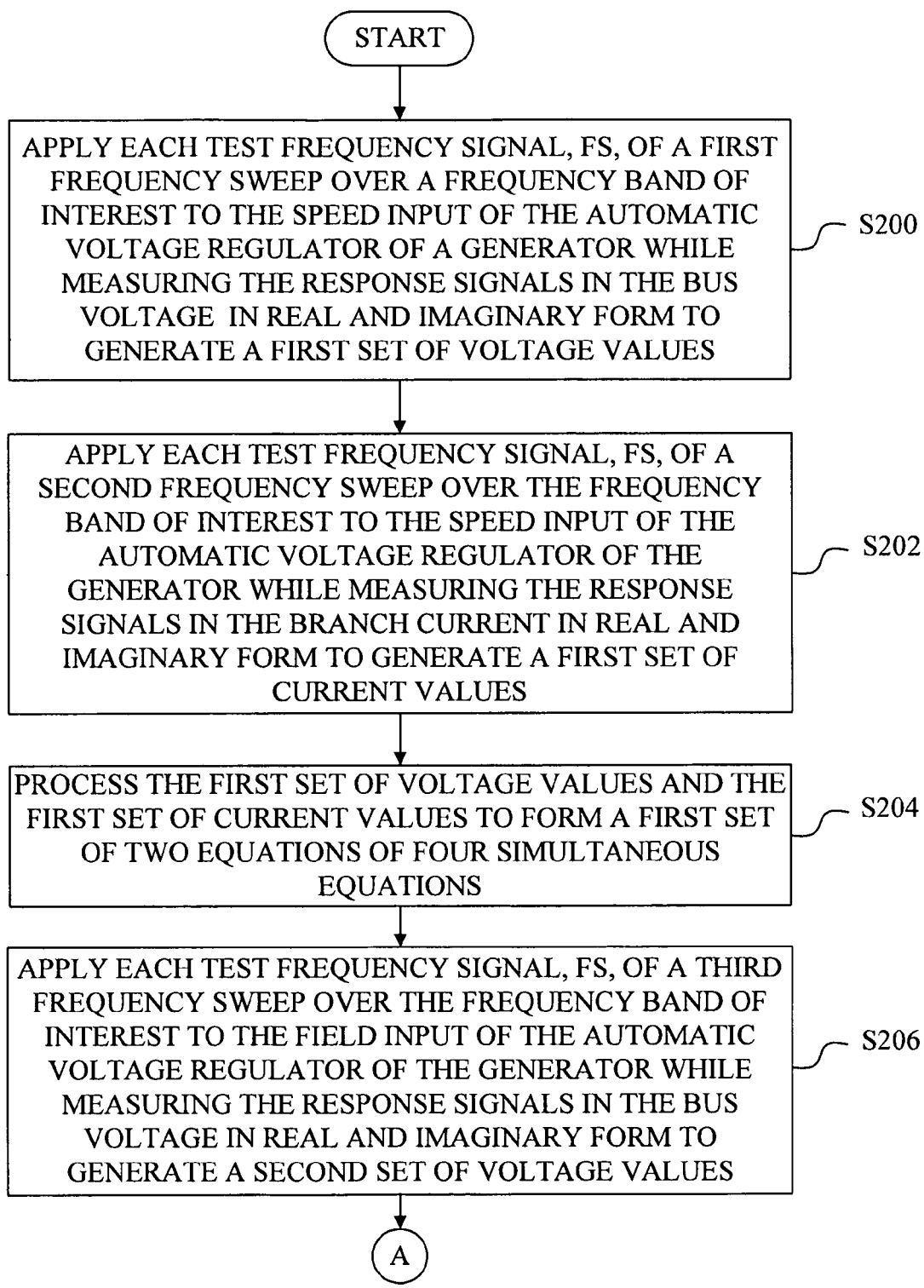
FIGS. 21A and 21B form a flowchart of a method for determining the D-Q impedance parameters Zqq, Zqd, Zdq and Zdd of generator GEN1 in the configuration of FIG. 20A.
Figure 21B:
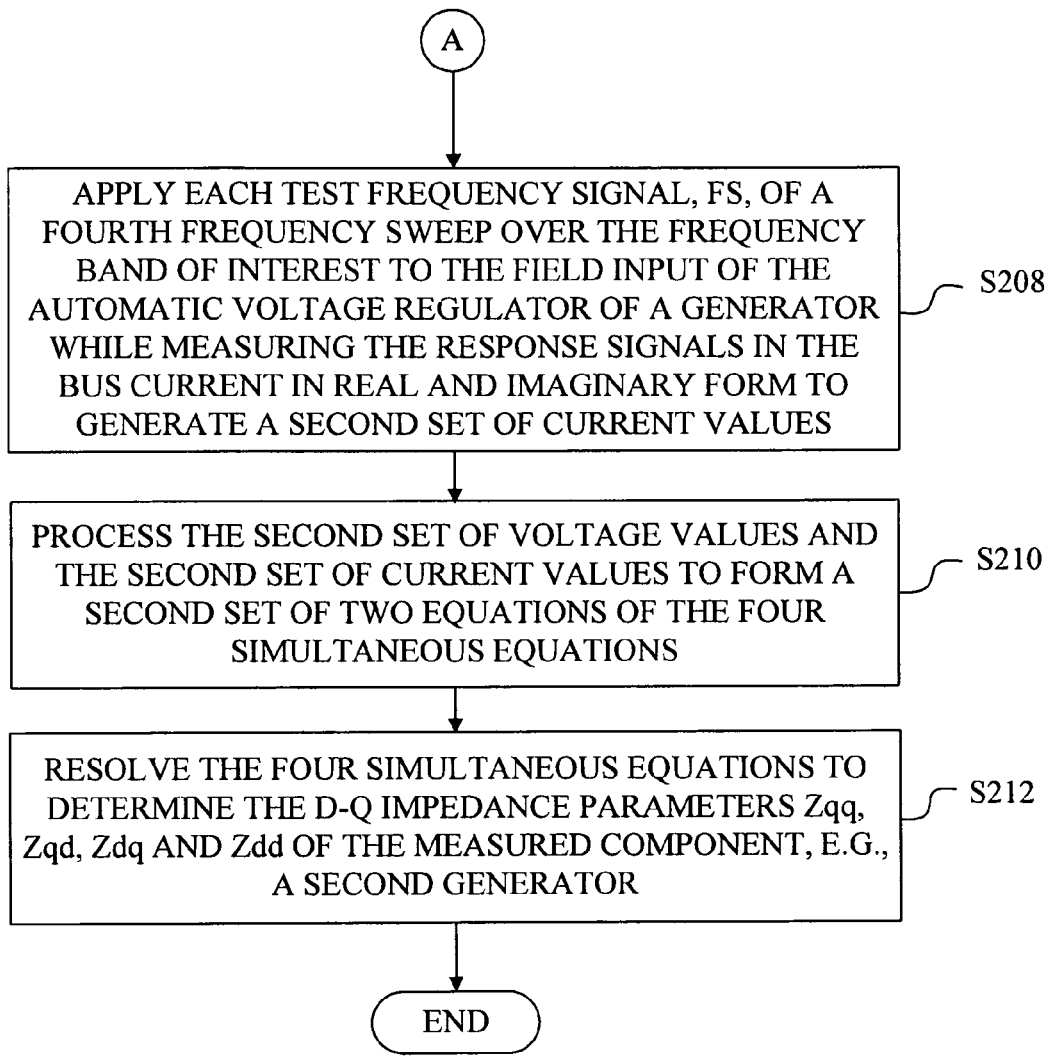

FIGS. 21A and 21B form a flowchart of a method for measuring D-Q impedance (i.e., parameters Zqq, Zqd, Zdq and Zdd) of a component of a plurality of polyphase power grid components connected to a grid node 12 in a polyphase power grid 10, the component being at least one electrical device. Such an electrical device may be, for example, a generator, a motor, a transmission line, transformer, capacitor, etc. Thus, as used herein, a component may include one or more electrical devices, including multiple electrical devices of a similar type (e.g., multiple generators operating on the same current branch of the polyphase power grid 10), or of differing types (e.g., a generator and associated transformer station). In the embodiment of FIG. 20A, for example, exemplary components include generator GEN1, generator GEN3, and the transmission lines whose impedance is represented by ZLink A, B, C. The transmission lines may include taps connecting industrial and residential loads.

In the arrangement as illustrated in FIG. 20A, generator GEN3 is one component of the plurality of polyphase power grid components, and is coupled to polyphase power grid 12. Generator GEN3 has speed input RPM to regulate generator no-load speed and field input FLD to regulate field excitation of generator GEN3, with the no-load speed and field excitation being amplitude modulated to cause generator GEN3 connected to grid node 12 on polyphase power grid 12 to induce suppressed-carrier stimulus current into grid node 12 in a manner that provides at least two forms of stimulus current to produce response signals that are independent. The measuring is performed by circuitry as described above to measure the response signals of suppressed-carrier form existing within a bus voltage VBUS at grid node 12 and a branch current ICT1 of the component being measured, which in the present case is generator GEN1.

The method of FIGS. 21A and 21B will now be described in more detail with respect to the test configuration illustrated in FIG. 20A. In accordance with the present method, the configuration shown in FIG. 20A uses four frequency sweeps to collect the data needed for the four simultaneous equations that are resolved to determine the D-Q impedance (i.e., parameters Zqq, Zqd, Zdq and Zdd) of generator GEN1.

At act S200, each test frequency signal, Fs, of a first frequency sweep over a frequency band of interest is applied by signal conditioning and switching unit SCSU to speed input RPM of automatic voltage regulator AVR of generator GEN3 while network analyzer 20 measures the response signals in the bus voltage VBUS in real and imaginary form to generate a first set of voltage values ($Vq_{(1\ to\ x)}$, $Vd_{(1\ to\ x)}$). Note that the switch circuit SELECT is set to connect voltage VBUS to channel B (CHAN B) of network analyzer 20. The frequency band of interest for the present embodiment may be, for example, from 0.1 Hertz to 40 Hertz.

Optionally, a small corrective signal may be applied to the field input FLD of automatic voltage regulator AVR of generator GEN3 when test frequency signal, Fs, is applied by signal conditioning and switching unit SCSU to the speed input RPM of automatic voltage regulator AVR to cancel the small phase shift that occurs when the speed signal supplied to speed input RPM is varied.

At act 202, each test frequency signal, Fs, of a second frequency sweep over the frequency band of interest is applied by signal conditioning and switching unit SCSU to the speed input RPM of automatic voltage regulator AVR of generator GEN3 while network analyzer 20 measures the response signals in the branch current ITC1 in real and imaginary form to generate a first set of current values ($Iq_{(1\ to\ x)}$, $Id_{(1\ to\ y)}$). This time, the switch circuit SELECT is set to connect current ICT1 to channel B (CHAN B) of network analyzer 20.

Again, optionally, a small corrective signal may be applied to the field input FLD when test frequency signal, Fs, is applied by signal conditioning and switching unit SCSU to the speed input RPM to cancel the small phase shift that occurs when the speed signal supplied to speed input RPM is varied At act S204, the first set of voltage values and the first set of current values are processed to form a first set of two equations of four simultaneous equations, in accordance with Equation (7) and Equation (8). In the present embodiment, the processing of act S204 is performed by computer 24.

At act S206, each test frequency signal, Fs, of a third frequency sweep over the frequency band of interest is applied by signal conditioning and switching unit SCSU to field input FLD of automatic voltage regulator AVR of generator GEN3 while network analyzer 20 measures the response signals in the bus voltage VBUS in real and imaginary form to generate a second set of voltage values ($Vq_{(1\ to\ x)}$, $Vd_{(1\ to\ x)}$). Note that the switch circuit SELECT is set to connect voltage VBUS to channel B (CHAN B) of network analyzer 20.

At act S208, each test frequency signal, Fs, of a fourth frequency sweep over the frequency band of interest is applied by signal conditioning and switching unit SCSU to the field input FLD of automatic voltage regulator AVR of generator GEN3 while network analyzer 20 measures the response signals in the bus current ITC1 in real and imaginary form to generate a second set of current values ($Iq_{(1\ to\ x)}$, $Id_{(1\ to\ y)}$). This time, the switch circuit SELECT is set to connect current ICT1 to channel B (CHAN B) of network analyzer 20.

At act S210, the second set of voltage values and the second set of current values are processed to form a second set of two equations of the four simultaneous equations, in accordance with Equation (7) and Equation (8). In the present embodiment, the processing of act S210 is performed by computer 24.

At act S212, the four simultaneous equations are resolved to determine the D-Q impedance parameters Zqq, Zqd, Zdq and Zdd of the measured component, e.g., generator GEN1 in the present embodiment. Act S212 may be performed, for example, by computer 24 which is used to control the subject tests. Computer 24 may be executing, for example, LabVIEW software available from National Instruments Corporation.

It is desirable that the system conditions remain sufficiently stationary over the time required for the four frequency sweeps to produce the desired data accuracy.

Use of similar combinations of test frequency signals, Fs, applied to the speed input RPM and field input FLD are expected to be useful in measuring the D-Q impedance of components attached to weak power systems that are less than stiff. For smaller power grids employing only a few generators operating in parallel, the field FLD and speed input RPM controls are the primary means of adjusting the grid voltage and load sharing of the generators. The approach outlined above may also be applied to measuring the D-Q impedance of other grid components, such as ZLINK (A,B,C) looking into the transmission lines. For the measurement of ZLINK (A,B,C), the current transformers are repositioned to a configuration such as that shown in FIG. 15.

The effect of adjustment to the field input FLD may include nonlinear distortion in the stimulus current as a result of magnetic saturation as the response to field current departs from the air-gap line. For measurement of D-Q impedance, the imposed variation in speed input RPM and field input FLD would normally be very small, of the order of one percent. Therefore, the effect of nonlinearities would be expected to be very small. However, the effects of relatively large current variations at the speed input RPM and field input FLD may result in an unacceptable degree of nonlinearity, in which case where nonlinearity is of concern, the signal conditioning and switching unit SCSU may include pre-distortion circuitry that will tend to compensate for system nonlinearity.

Figure 20B:
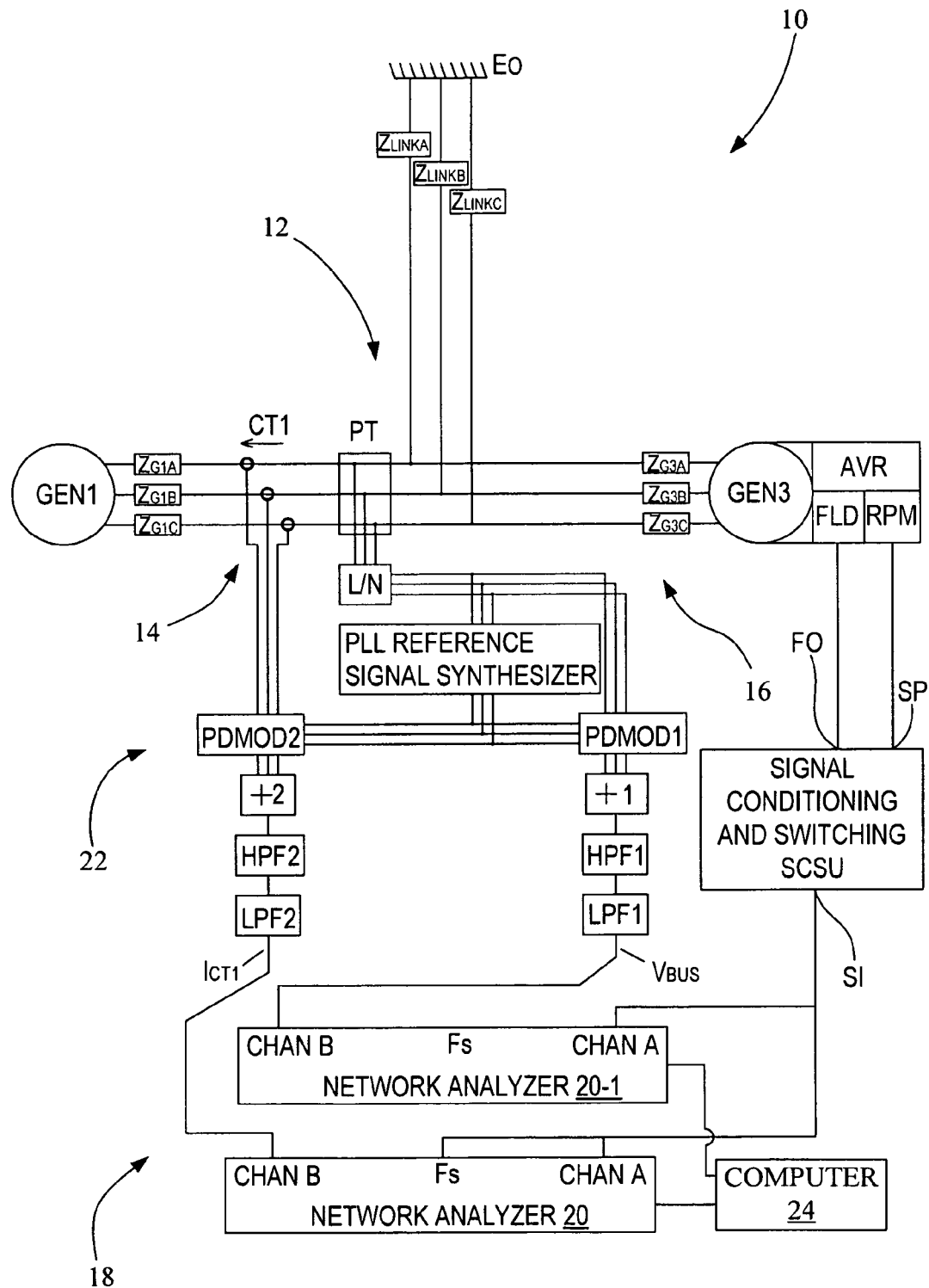
FIG. 20B is a diagram showing an alternative test setup for measurement of the D-Q impedance of a generator, or group of generators, represented by GEN1.

The configuration shown in FIG. 20B is similar to that of FIG. 20A, with the exception that the configuration shown in FIG. 20B uses two two-channel network analyzers, such as two Hp3563A Control System Analyzers from Hewlett-Packard, Co., although a single four-channel network analyzer, such as the Hp35670A Dynamic Signal Analyzer available from Hewlett-Packard, Co. also could be used. As a result, the configuration of FIG. 20B does not include the switch circuit SELECT (see FIG. 20A). Rather, low pass filter LPF1 is electrically coupled to channel B (CHAN B) of network analyzer 20-1 to supply thereto the voltage signal VBUS, and low pass filter LPF2 is electrically coupled to channel B (CHAN B) of network analyzer 20 to supply thereto the current signal ICT1. Also, channel A (CHAN A) of network analyzer 20-1 is electrically coupled to channel A (CHAN A) of network analyzer 20, which is connected to test frequency signal, FS. A computer 24 is communicatively coupled to each of network analyzer 20-1 and network analyzer 20. A common external frequency reference (not shown) is used to synchronize network analyzer 20-1 and network analyzer 20.

Figure 22A:
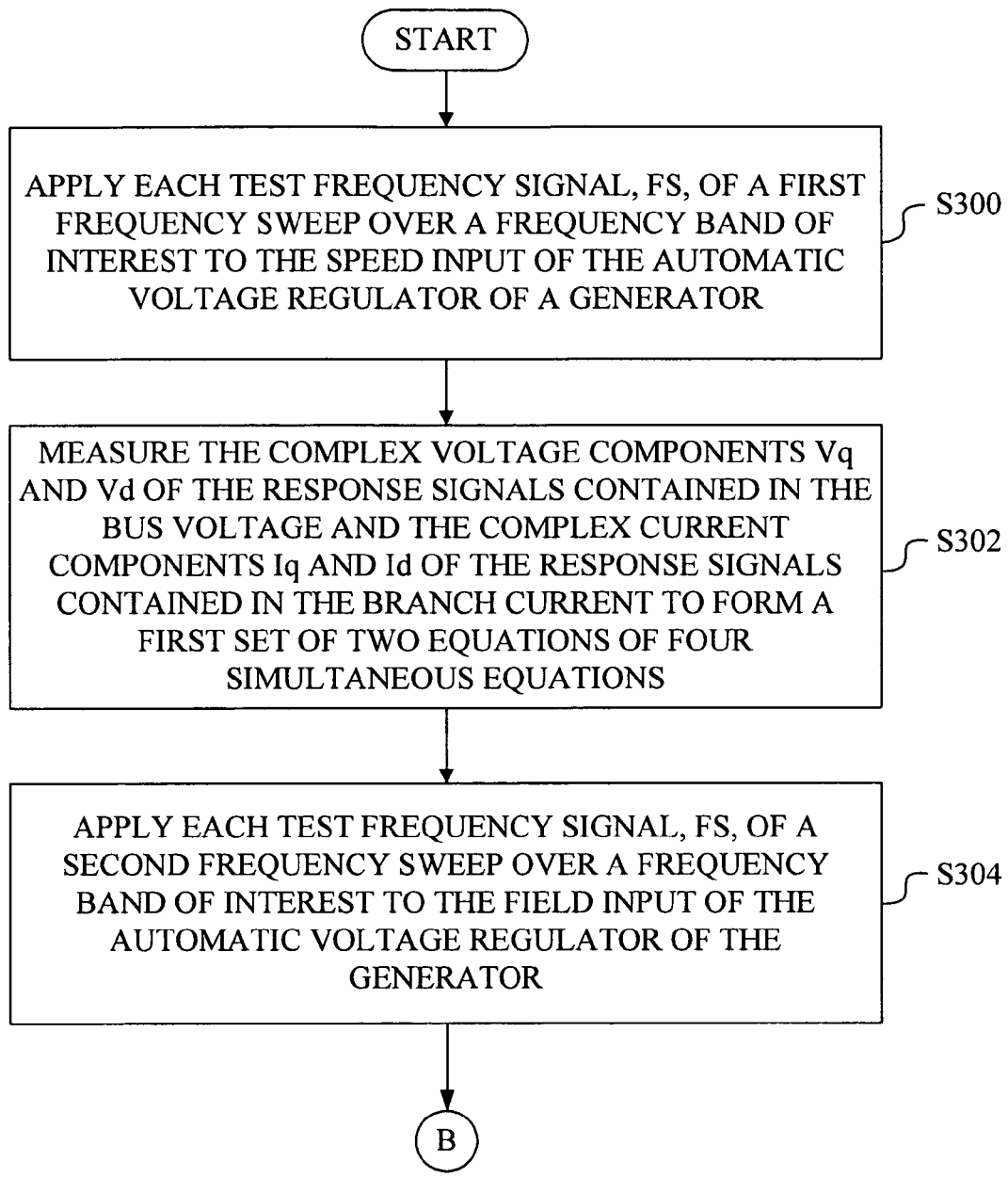
FIGS. 22A and 22B form a flowchart of a method for determining the D-Q impedance parameters Zqq, Zqd, Zdq and Zdd of generator GEN1 in the configuration of FIG. 20B.
Figure 22B:
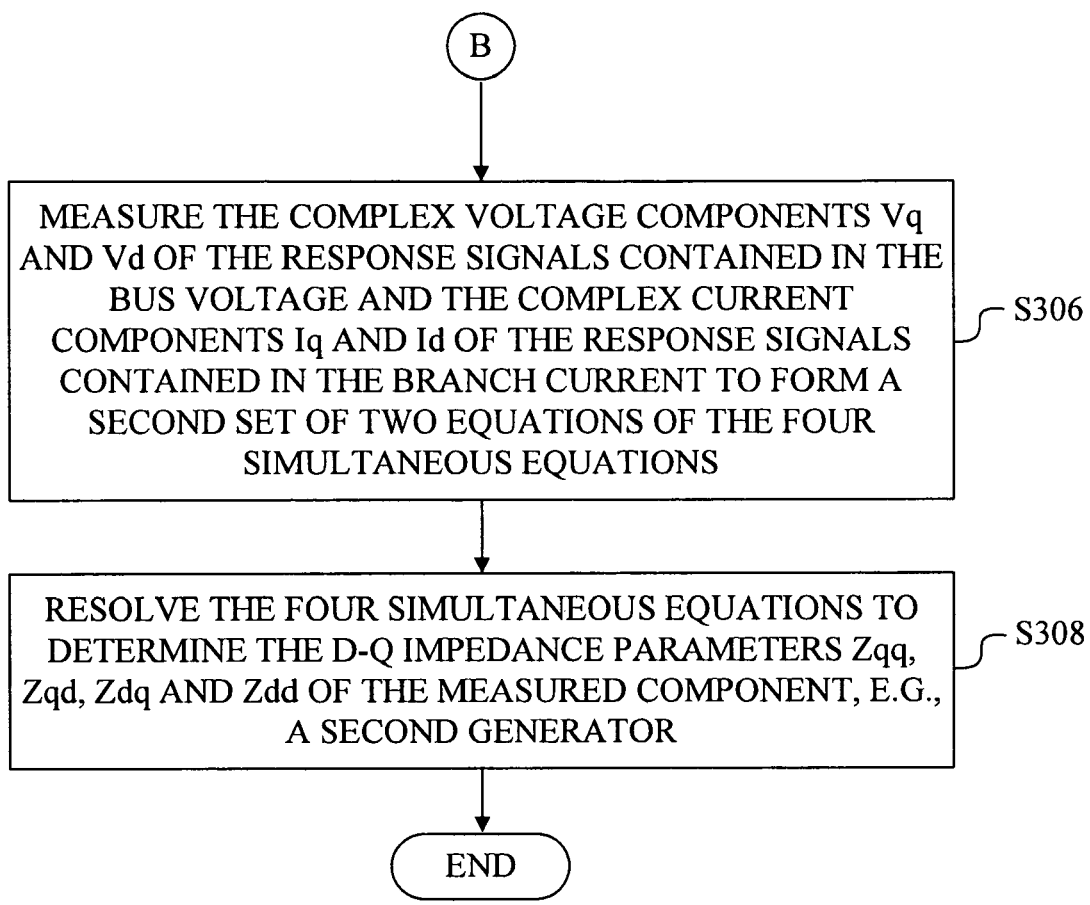

FIGS. 22A-22C form a flowchart of a method associated with the configuration shown in FIG. 20A for measuring D-Q impedance (i.e., parameters Zqq, Zqd, Zdq and Zdd) of a component of a plurality of polyphase power grid components connected to a grid node 12 in a polyphase power grid 10, the component being at least one electrical device. Such an electrical device may be, for example, a generator, a motor, a transmission line, transformer, capacitor, etc. Thus, as used herein, a component may include one or more electrical devices, including multiple electrical devices of a similar type (e.g., multiple generators operating on the same current branch of the polyphase power grid 10), or of differing types (e.g., a generator and associated transformer station). In the embodiment of FIG. 20B, for example, exemplary components include generator GEN1, generator GEN3, and the transmission lines having an impedance represented by ZLink A, B, C.

In the arrangement as illustrated in FIG. 20B, generator GEN3 is one component of the plurality of polyphase power grid components, and is coupled to polyphase power grid 12. Generator GEN3 has speed input RPM to regulate generator no-load speed and field input FLD to regulate field excitation of generator GEN3, with the no-load speed and field excitation being used to cause generator GEN3 connected to grid node 12 on polyphase power grid 12 to induce suppressed-carrier stimulus current into grid node 12 in a manner that provides at least two forms of stimulus current to produce response signals that are independent. The measuring is performed by circuitry as described above to measure the response signals of suppressed-carrier form existing within a bus voltage VBUS at grid node 12 and a branch current ICT1 of the component being measured, which in the present embodiment is generator GEN1.

The method of FIGS. 22A-22B will now be described in more detail with respect to the test configuration illustrated in FIG. 20B. In accordance with the present method, the configuration shown in FIG. 20B uses two frequency sweeps to collect the data needed for the four simultaneous equations that are resolved to determine the D-Q impedance (i.e., parameters Zqq, Zqd, Zdq and Zdd) of generator GEN3.

At act S300, each test frequency signal, Fs, of a first frequency sweep over a frequency band of interest is applied by signal conditioning and switching unit SCSU to the speed input RPM of automatic voltage regulator AVR of generator GEN3. The frequency band of interest for the present embodiment may be, for example, from 0.1 Hertz to 40 Hertz.

Optionally, a small corrective signal may be applied to the field input FLD of automatic voltage regulator AVR of generator GEN3 when test frequency signal, Fs, is applied by signal conditioning and switching unit SCSU to the speed input RPM of automatic voltage regulator AVR to cancel the small phase shift that occurs when the speed signal supplied to speed input RPM is varied.

At act S302, complex voltage components Vq and Vd of the response signals contained in the bus voltage VBUS and complex current components Iq and Id of the response signals contained in the branch current ITC1 are measured by network analyzer 20-1 and network analyzer 20, respectively, to form a first set of two equations of four simultaneous equations in accordance with Equation (7) and Equation (8).

At act S304, each test frequency signal, Fs, of a second frequency sweep over a frequency band of interest is applied by signal conditioning and switching unit SCSU to the field input FLD of automatic voltage regulator AVR of generator GEN3.

At act S306, complex voltage components Vq and Vd of the response signals contained in the bus voltage VBUS and complex current components Iq and Id of the response signals contained in the branch current ICT1 are measured by network analyzer 20-1 and network analyzer 20, respectively, to form a second set of two equations of the four simultaneous equations in accordance with Equation (7) and Equation (8).

At act S308, the four simultaneous equations are resolved to determine the D-Q impedance parameters Zqq, Zqd, Zdq and Zdd of the measured component, e.g., generator GEN1. Act S308 may be performed, for example, by computer 24 which is used to control the subject tests. Computer 24 may be executing, for example, LabVIEW software available from National Instruments Corporation.

Because the test configuration of FIG. 20B measures voltage VBUS and current ICT1 simultaneously, the potential for errors resulting from changes in system conditions over time are greatly reduced. Also, the test time required for the configuration of FIG. 20B is less than half that of the configuration of FIG. 20A.

With the D-Q impedance obtained using one of the methods described above, the margin of stability of system of interconnected components can be evaluated using the Nyquist criteria, using for example, computer 24. Assuming that the system configuration is such that the interface at the node, e.g., grid node 12, in question can be described by the complex ratio of source impedance, ZS, to the load impedance, ZL as ZS/ZL, the values of ZS and ZL may be determined as follows:

$$Z = \frac{V}{I} \qquad \text{Equation (9)}$$

$$V = Vq + jVd \qquad \text{Equation (10)}$$

$$I = Iq + jId \qquad \text{Equation (11)}$$

$$Vq = ZqqIq + ZqdId \qquad \text{Equation (12)}$$

$$Vd = ZdqIq + ZddId \qquad \text{Equation (13)}$$

$$Iq = \cos\theta \qquad \text{Equation (14)}$$

$$Id = \sin\theta \qquad \text{Equation (15)}$$

The process defined by Equations (9)-(15) is repeated to define source impedance ZS and load impedance ZL as functions of θ. The ratio ZS(θ, ω)/ZL(θ, ω) defines the margin of stability.

$$X = \Re\left(\frac{(ZS(\theta, \omega))}{(ZL(\theta, \omega))}\right) \quad \text{Equation (16)}$$

$$Y = \Im\left(\frac{(ZS(\theta, \omega))}{(ZL(\theta, \omega))}\right) \quad \text{Equation (17)}$$

The quantities X and Y define the Cartesian coordinates of the Nyquist diagram at a given frequency point. The Nyquist diagram is plotted over the full frequency range of interest for a given value of θ. The Nyquist diagram is then replotted for values of θ over the range ±π/2. At the value of θ that displays the closest approach of the Nyquist diagram to the point −1+j0, the margin of stability may be measured by conventional means.

The fact that the shape of the Nyquist diagram changes as a function of θ may appear to present a conflict between the method described above with respect to FIGS. 20A and 20B and the method to produce a Nyquist diagram described further above using only single-angle stimulus aligned predominantly along the Q axis. This apparent conflict may, perhaps, be resolved by consideration of the following notional analysis.

(1) When the conditions are such the Nyquist diagram passes near the point −1+j0, ZS and ZL form an approximate conjugate match and the series impedance of these two quantities is predominantly negative real. Q-axis stimulus is optimum under these conditions. For any stimulus current aligned at less than ±π/4 relative to the Q axis, the stimulus has a predominant Q-axis component of seventy percent, or more, and this stimulus is reasonably optimum.

(2) As the Nyquist diagram approaches the point −1+j0, the system being evaluated may be considered comparable to a high-Q circuit in which the stimulus related current flowing in the circuit is Q times the stimulus current supplied from the stimulus source. This regenerative characteristic of the system is such that it becomes largely self-stimulating, with only the frequency of the circulating stimulus current being determined by the external stimulus. For situations in which the margin of stability is a function of the angle θ, the regenerative characteristic would cause the Q times current to be maximized at the value of θ that minimizes the margin of stability. Direct measurement of stability margin, using a single frequency sweep and a single angle stimulus, is effective and not sensitive to the phase alignment of the stimulus current so long as the stimulus current is aligned predominantly along the Q axis. Experience thus far has shown this to be true.

The invention described above may be used, for example, by determining the D-Q impedance matrix values that characterize components of the power grid. This information would be useful in analyzing the performance of the power grid in its existing configuration and in evaluating the effects of planned changes prior to implementation of these changes. Measured D-Q matrix impedance values would provide information necessary for more accurate computer modeling of the power grid.

As a further example, the invention described above may be used in maximizing transmission system capacity, thereby avoiding excessively conservative limitations placed upon transmission capacity with the purpose of avoiding oscillatory instability, and allowing the transmission system to operate near maximum capacity.

As a further example, the invention described above may be used in evaluating the effects of various forms of loads on the power grid, such as the negative impedance characteristics of switchmode power converters, variable speed drives, induction motors and synchronous motors, which contribute to oscillatory instability.

Also, the invention described above may be used, for example, in providing a better understanding the power system components and their interactions, and an understanding of the characteristics required of system modifications intended to help stabilize the transmission system against subsynchronous resonance by providing quantitative evaluation of such modifications. A better understanding of power system components and their interaction will become increasingly important as more distributed energy sources are added to the power grid.

While this invention has been described with respect to embodiments of the invention, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A method for measuring D-Q impedance of a component of a plurality of polyphase power grid components connected to a grid node in a polyphase power grid, said component being at least one electrical device, said plurality of components including a generator, as one component of said plurality of polyphase power grid components, coupled to said polyphase power grid, said generator, having a speed input to regulate generator no-load speed and a field input to regulate field excitation of said generator, with said no-load speed and field excitation being used to cause said generator connected to said grid node on said polyphase power grid to induce suppressed-carrier stimulus current into said grid node to produce response signals, said measuring being performed by circuitry to measure said response signals of suppressed-carrier form existing within a bus voltage at said grid node and a branch current of said component being measured, said method comprising:

applying each test frequency signal of a first frequency sweep over a frequency band of interest to said speed input of said generator while measuring said response signals in said bus voltage in real and imaginary form to generate a first set of voltage values;

applying each test frequency signal of a second frequency sweep over said frequency band of interest to said speed input of said generator while measuring said response signals in said branch current in real and imaginary form to generate a first set of current values;

processing said first set of voltage values and said first set of current values to form a first set of two equations of four simultaneous equations;

applying each test frequency signal of a third frequency sweep over said frequency band of interest to said field input of said generator while measuring said response signals in said bus voltage in real and imaginary form to generate a second set of voltage values;

applying each test frequency signal of a fourth frequency sweep over said frequency band of interest to said field input of said generator while measuring said response signals in said bus current in real and imaginary form to generate a second set of current values;

processing said second set of voltage values and said second set of current values to form a second set of two equations of said four simultaneous equations; and resolving said four simultaneous equations to determine said D-Q impedance parameters Zqq, Zqd, Zdq and Zdd of said measured component.

2. The method of claim 1, where said field input and said speed input are associated with an automatic voltage regulator of said generator.

3. The method of claim 1, further comprising applying a corrective signal to said field input when said test frequency signal is applied to said speed input to cancel a small phase shift that occurs when a speed signal supplied to said speed input is varied.

4. The method of claim 1, wherein said processing of said first set of voltage values and said first set of current values, said processing of said second set of voltage values and said second set of current values, and said resolving of said four simultaneous equations to determine said D-Q impedance parameters Zqq, Zqd, Zdq and Zdd of said measured component is performed by a network analyzer in conjunction with a computer.

5. The method of claim 1, further comprising evaluating said D-Q impedance parameters to construct a plurality of Nyquist diagrams, the shape of which is a function of the phase angle of the stimulus current, the phase angle being measured in relation to the D-Q coordinate axes, and using a Nyquist criteria to determine a margin of stability at said grid node.

6. The method of claim 1, wherein said frequency band of interest is from 0.1 Hertz to 40 Hertz.

7. The method of claim 1, wherein said measured component is a second generator.

8. A method for measuring D-Q impedance of a component of a plurality of polyphase power grid components connected to a grid node in a polyphase power grid, said component being at least one electrical device, said plurality of components including a generator, as one component of said plurality of polyphase power grid components, coupled to said polyphase power grid, said generator having a speed input to regulate generator no-load speed and a field input to regulate field excitation of said generator, with said no-load speed and field excitation being used to cause said generator connected to said grid node on said polyphase power grid to induce suppressed-carrier stimulus current into said grid node to produce response signals said measuring being performed by circuitry to measure said response signals of suppressed-carrier form existing within a bus voltage at said grid node and a branch current of said component being measured, the method comprising:

applying each test frequency signal of a first frequency sweep over a frequency band of interest to said speed input of said generator;

measuring complex voltage components of said response signals contained in said bus voltage and complex current components of said response signals contained in said branch current to form a first set of two equations of four simultaneous equations;

applying each test frequency signal of a second frequency sweep over a frequency band of interest to said field input of said generator;

measuring complex voltage components of said response signals contained in said bus voltage and complex current components of said response signals contained in said branch current to form a second set of two equations of said four simultaneous equations; and resolving said four simultaneous equations to determine said D-Q impedance parameters Zqq, Zqd, Zdq and Zdd of said measured component.

9. The method of claim 8, where said field input and said speed input are associated with an automatic voltage regulator of said generator.

10. The method of claim 8, further comprising applying a corrective signal to said field input when said test frequency signal is applied to said speed input to cancel a small phase shift that occurs when a speed signal supplied to said speed input is varied.

11. The method of claim 8, wherein said acts of measuring is performed by at least one network analyzer, and said resolving of said four simultaneous equations to determine said D-Q impedance parameters Zqq, Zqd, Zdq and Zdd of said measured component is performed by a computer communicatively coupled to said at least one network analyzer.

12. The method of claim 8, further comprising evaluating said D-Q impedance parameters using a Nyquist criteria to determine a margin of stability at said grid node.

13. The method of claim 8, wherein said frequency band of interest is from 0.1 Hertz to 40 Hertz.

14. The method of claim 8, wherein said measured component is a second generator.

* * * * *